(12) United States Patent
Matsubara

(10) Patent No.: US 6,277,735 B1
(45) Date of Patent: Aug. 21, 2001

(54) METHOD FOR FORMING A REFRACTORY METAL SILICIDE LAYER

(75) Inventor: Yoshihisa Matsubara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/593,384

(22) Filed: Jun. 14, 2000

Related U.S. Application Data

(62) Division of application No. 08/742,595, filed on Oct. 28, 1996, now Pat. No. 6,096,638.

(30) Foreign Application Priority Data

Oct. 28, 1995 (JP) .................................................. 7-303928
Oct. 4, 1996 (JP) .................................................. 8-263906

(51) Int. Cl.⁷ ........................ H01L 21/4763; H01L 21/44
(52) U.S. Cl. ..................... 438/649; 438/655; 438/660; 438/663; 438/683
(58) Field of Search ................................ 438/583, 649, 438/655, 660, 663, 683, 685, 721, 755

(56) References Cited

U.S. PATENT DOCUMENTS

| | | |
|---|---|---|
| 4,476,157 | 10/1984 | Shinozaki . |
| 4,545,116 | 10/1985 | Lau . |
| 4,643,914 * | 2/1987 | D'Avitaya et al. ..................... 427/93 |
| 4,777,150 * | 10/1988 | Deneuville et al. .................. 437/200 |
| 5,185,211 | 2/1993 | Sue et al. . |
| 5,494,860 | 2/1996 | McDevitt et al. . |
| 5,550,084 | 8/1996 | Anjum et al. . |
| 5,665,209 | 9/1997 | Byun . |
| 5,766,997 | 6/1998 | Takeuchi . |
| 5,801,425 * | 9/1998 | Kuroi et al. .......................... 257/385 |
| 5,829,658 | 11/1998 | Colombani . |
| 5,836,623 | 11/1998 | Bothell et al. . |
| 6,096,638 * | 8/2000 | Matsubara ............................. 438/649 |
| 6,180,519 * | 1/2001 | Kuroi et al. .......................... 438/649 |

OTHER PUBLICATIONS

Jeong Soo Byun et al., "TiN/TiSi$_2$ Formation Using TiN$_x$ Layer and Its Feasibilities in ULSI", Japanese Journal of Applied Physics, Part 1, vol. 34, No. 2B, pp. 982–986.

* cited by examiner

Primary Examiner—John F. Niebling
Assistant Examiner—Walter L. Lindsay, Jr.
(74) Attorney, Agent, or Firm—Young & Thompson

(57) ABSTRACT

A method for forming a refractory metal silicide layer on a silicon surface in which a first layer of a refractory metal is formed on the silicon surface. A second layer extends over the first layer and is made of a nitrogen containing refractory metal. The silicon surface and the first and second layers are subjected to a heat treatment in an argon gas atmosphere to form a refractory metal silicide layer on an interface between the silicon surface and the first layer.

34 Claims, 24 Drawing Sheets

102 : field oxide film
103 : gate oxide film
104 : gate electrode
105 : side wall oxide film
106 : diffusion layer
108A : titanium nitride1g titanium
109 : C49 structured titanium silicide layer
110 : nitrogen containing titanium 101 : silicon substrate
102 : field oxide film
103 : gate oxide film
104 : gate electrode
105 : side wall oxide film
106 : diffusion layer
109 : C49 structured titanium silicide layer
111 : C54 structured titanium silicide layer 101 : silicon substrate
104 : gate electrode
106 : diffusion layer 101 : silicon substrate
104 : gate electrode
106 : diffusion layer
107 : titanium film

- 101 : silicon substrate
- 104 : gate electrode
- 106 : diffusion layer
- 109 : C49 structured titanium silicide layer
- 110 : nitrogen containing titanium

- 101 : silicon substrate
- 104 : gate electrode
- 106 : diffusion layer
- 109 : C49 structured titanium silicide layer 101 : silicon substrate
104 : gate electrode
111 : C54 structured titanium silicide layer 101 : silicon substrate
104 : gate electrode
106 : diffusion layer 101 : silicon substrate
104 : gate electrode
106 : diffusion layer
107 : titanium film
108 : titanium nitride film

- 101 : silicon substrate
- 104 : gate electrode
- 106 : diffusion layer
- 108 : titanium nitride film
- 109 : C49 structured titanium silicide layer
- 110 : nitrogen containing titanium

- 101 : silicon substrate
- 104 : gate electrode
- 106 : diffusion layer
- 109 : C49 structured titanium silicide layer 101 : silicon substrate
104 : gate electrode
106 : diffusion layer
111 : C54 structured titanium silicide layer 101 : silicon substrate
104 : gate electrode
106 : diffusion layer 101 : silicon substrate
104 : gate electrode
106 : diffusion layer
107 : titanium film
108 : titanium nitride film

- 101 : silicon substrate
- 104 : gate electrode
- 106 : diffusion layer
- 107 : titanium film
- 109 : C49 structured titanium silicide layer
- 110 : nitrogen containing titanium

- 101 : silicon substrate
- 104 : gate electrode
- 106 : diffusion layer
- 109 : C49 structured titanium silicide layer 101 : silicon substrate
104 : gate electrode
106 : diffusion layer
111 : C54 structured titanium silicide layer 101 : silicon substrate
104 : gate electrode
106 : diffusion layer 101 : silicon substrate
104 : gate electrode
106 : diffusion layer
107 : titanium film 101 : silicon substrate
104 : gate electrode
106 : diffusion layer
107 : titanium film
110 : nitrogen containing titanium 101 : silicon substrate
104 : gate electrode
106 : diffusion layer
107 : titanium film
109 : C49 structured titanium silicide layer
110 : nitrogen containing titanium 101 : silicon substrate
104 : gate electrode
106 : diffusion layer
111 : C54 structured titanium silicide layer 101 : silicon substrate
102 : field oxide film
103 : gate oxide film
104 : gate electrode
105 : side wall oxide film
106 : diffusion layer 107 : titanium film
108 : nitrogen containing titanium 102 : field oxide film
103 : gate oxide film
104 : gate electrode
105 : side wall oxide film
106 : diffusion layer
108 : nitrogen containing titanium
109 : C49 structured titanium silicide layer
110 : nitrogen containing titanium 101 : silicon substrate
102 : field oxide film
103 : gate oxide film
104 : gate electrode
105 : side wall oxide film
106 : diffusion layer
109 : C49 structured titanium silicide layer 101 : silicon substrate
102 : field oxide film
103 : gate oxide film
104 : gate electrode
105 : side wall oxide film
106 : diffusion layer
111 : C54 structured titanium silicide layer 101 : silicon substrate
102 : field oxide film
103 : gate oxide film
104 : gate electrode
105 : side wall oxide film
106 : diffusion layer 104 : gate electrode
106 : diffusion layer
107 : titanium film
106 : diffusion layer
107 : titanium film 104 : gate electrode
106 : diffusion layer
107 : titanium film
108A : titanium nitride 102 : field oxide film
103 : gate oxide film
104 : gate electrode
105 : side wall oxide film
106 : diffusion layer
108A : titanium nitrideig titanium
109 : C49 structured titanium silicide layer
110 : nitrogen containing titanium 101 : silicon substrate
102 : field oxide film
103 : gate oxide film
104 : gate electrode
105 : side wall oxide film
106 : diffusion layer
109 : C49 structured titanium silicide layer
111 : C54 structured titanium silicide layer

METHOD FOR FORMING A REFRACTORY METAL SILICIDE LAYER

CROSS-REFERENCE TO RELATED APPLICATIONS

This application is a division of copending application Ser. No. 08/742,595, filed Oct. 28, 1996 now U.S. Pat. No. 6,096,638.

BACKGROUND OF THE INVENTION

The present invention relates to a method for forming a refractory metal silicide layer, and more particularly to a method for forming a refractory metal silicide layer self-aligned in a scaled down MOS field effect transistor.

In recent years, the requirement for scaling down in vertical and lateral dimensions of semiconductor devices for realization of the high density integration has been on the increase. Sub-quarter micron size memory devices and logic devices, for example, in the range of 0.15–0.25 micrometers have been now required for ultra large scale integrated circuits. Such high density integration of the semiconductor devices requires lateral and vertical size scaling down of the semiconductor elements such as MOS field effect transistor. Reductions in gate length and source/drain diffusion layer width are required as a lateral scaling down as well as reduction in thickness of the layers provided in the semiconductor element is also required as a vertical scaling down. Such reductions in gate length and source/drain diffusion layer width as well as reduction in thickness of the layers in the semiconductor elements, however, result in increase of in resistance thereof whereby the issue of circuit delay due to the increased resistance thereof is raised. Reduction in resistance of the semiconductor device is an essential issue for obtaining high speed performances of the ultra large scale integrated circuits. It is preferable to utilize a metal silicide layer for reduction in resistance of the semiconductor device and for scaling down thereof. Particularly, a refractory metal silicide such as titanium silicide is more preferable. In order to selectively form a fine refractory metal silicide layer on a limited small area, there had been used a self-aligned silicide salicide technique. Particularly, this salicide technique is important for scaling down of the MOS field effect transistor with high speed performance.

In the light of the scaling down of the MOS transistor with high speed performance, it is preferable that the source/drain diffusion regions are shallow. The silicidation reaction of refractory metal with silicon appears in the surface of the source/drain diffusion regions underlying the refractory metal layer. Namely, the refractory metal silicide layer is formed in upper regions of the source/drain diffusion layers. If the junction depth of the source/drain diffusion regions is shallower than the depth of the bottom of the refractory metal silicide layer, this means entire parts of the source/drain diffusion layers are occupied and replaced by the refractory metal silicide layer whereby the silicide layer is made into contact with the silicon substrate. This causes a crystal defect which may cause a leakage of current. In order to prevent this, it is required that the refractory metal silicide layer be formed within upper region of the source/drain diffusion regions or shallower than the source/drain diffusion regions.

Accordingly, in order to realize a substantial scaling down of the semiconductor device such as MOS field effect transistors including refractory metal silicide layers, it is essential to form the refractory metal silicide layer extremely shallow or form an extremely thin refractory metal silicide layer.

One of the conventional methods for forming the MOS field effect transistor by use of the salicide technique is disclosed in the Japanese patent publication No. 3-65658 and will be described as follows.

With reference to FIG. 1A, a silicon substrate 101 was prepared. Field oxide films 102 were selectively formed by a local oxidation of silicon method on a surface of the silicon substrate 101 so as to define an active region surrounded by the field oxide films 102. Further, an ion implantation of impurity into the active region was carried out to form channel stoppers. Subsequently, a thermal oxidation of silicon was carried out to form a gate oxide film 103. A chemical vapor deposition method was carried out to form a polysilicon film having a thickness of 150 nanometers over an entire region of the substrate 101. An n-type impurity such as phosphorus was doped into the deposited polysilicon film so as to reduce a resistivity of the polysilicon film. The impurity doped polysilicon film was then patterned by a photolithography to form a gate electrode 104. A chemical vapor deposition was carried out to deposit a silicon oxide film on an entire region of the substrate 101. The deposited silicon oxide film was then subjected to an anisotropic etching to form side wall oxide films 105 at opposite sides of the gate electrode 104. An ion-implantation of arsenic into the substrate 101 was carried out and then the substrate 101 was subjected to a heat treatment at a temperature of about 800–1000° C. to cause a diffusion of the doped impurity whereby source/drain regions 106 were formed.

With reference to FIG. 1B, a titanium film 107 having a thickness of about 50 nanometers was deposited by a sputtering method on an entire region of the substrate 101.

With reference to FIG. 1C, the substrate 101 was subjected to a lamp anneal in a nitrogen atmosphere at a temperature of 600–650° C. for 30–60 seconds whereby a silicidation reaction of titanium with silicon appeared on interfaces of the titanium film 107 to the polysilicon gate electrode 104 and to the silicon diffusion layers 106 acting as the source/drain regions. As a result, C49 structured titanium silicide layers 109 having a resistivity of about 60 $\mu\Omega$ cm were formed on the interfaces of the titanium film 107 to the polysilicon gate electrode 104 and to the silicon diffusion layers 106.

With reference to FIG. 1D, the nitrogen containing titanium film 110 was removed by a wet etching which uses a chemical in which hydrogen peroxide is mixed in an ammonia solution so as to leave only the C49 structured titanium silicide layer 109 over the polysilicon gate electrode 104 and over the source and drain diffusion regions 106.

With reference to FIG. 1E, the substrate 101 was subjected to a secondary heat treatment in an argon atmosphere at a temperature of 850° C. for 60 seconds to cause a phase transition of the C49 structured titanium silicide layer 109 into a C54 structured titanium silicide layer 111 having a resistivity of 20 $\mu\Omega$ cm. The C54 structured titanium silicide layer 111 has a lower resistivity than the C49 structured titanium silicide layer 109, for which reason a sheet resistance of the titanium silicide layer is reduced by the secondary heat treatment.

Another of the conventional methods for forming the MOS field effect transistor by use of the salicide technique is disclosed in the Japanese patent publication No. 3-73533 and will be described as follows.

With reference to FIG. 2A, a silicon substrate 101 was prepared. Field oxide films 102 were selectively formed by a local oxidation of silicon method on a surface of the silicon substrate 101 so as to define an active region surrounded by the field oxide films 102. Further, an ion implantation of impurity into the active region was carried out to form a channel stopper. Subsequently, a thermal oxidation of silicon was carried out to form a gate oxide film 103. A chemical vapor deposition method was carried out to form a polysilicon film having a thickness of 150 nanometers over an entire region of the substrate 101. An n-type impurity such as phosphorus was doped into the deposited polysilicon film so as to reduce a resistivity of the polysilicon film. The impurity doped polysilicon film was then patterned by a photolithography to form a gate electrode 104. A chemical vapor deposition was carried out to deposit a silicon oxide film on an entire region of the substrate 101. The deposited silicon oxide film was then subjected to an anisotropic etching to form side wall oxide films 105 at opposite sides of the gate electrode 104. An ion-implantation of arsenic into the substrate 101 was carried out and then the substrate 101 was subjected to a heat treatment at a temperature of about 800–1000° C. to cause a diffusion of the doped impurity whereby source/drain regions 106 were formed.

With reference to FIG. 2B, a titanium film 107 having a thickness of more than 20 nanometers was deposited on an entire region of the substrate 101 by a sputtering method in an argon gas. A titanium nitride film 108 C is formed over the titanium film 107 by a sputtering method in an argon gas.

With reference to FIG. 2C, the substrate 101 was subjected to a lamp anneal in a nitrogen atmosphere whereby a silicidation reaction of titanium with silicon appeared on interfaces of the titanium film 107 to the polysilicon gate electrode 104 and to the silicon diffusion layers 106 acting as the source/drain regions. As a result, C49 structured titanium silicide layers 109 having a resistivity of about 15 $\mu\Omega$ cm were formed on the interfaces of the titanium film 107 to the polysilicon gate electrode 104 and to the silicon diffusion layers 106. Since the titanium film 107 is covered by the titanium nitride film 108 and the heat treatment was carried out in the nitrogen atmosphere, the titanium film 107 is not exposed to oxygen during the heat treatment for titanium silicidation, for which reason no titanium oxide film is formed. This allows a reduction in sheet resistance of the titanium silicide layer.

With reference to FIG. 2D, the nitrogen containing titanium film 110 and the titanium nitride film 108 were removed by a wet etching which uses a chemical in which hydrogen peroxide is mixed in an ammonia solution so as to leave only the C49 structured titanium silicide layer 109 over the polysilicon gate electrode 104 and over the source and drain diffusion regions 106.

With reference to FIG. 2E, the substrate 101 was subjected to a secondary heat treatment to cause a phase transition of the C49 structured titanium silicide layer 109 into a C54 structured titanium silicide layer 111. The C54 structured titanium silicide layer 111 has a lower resistivity than the C49 structured titanium silicide layer 109, for which reason a sheet resistance of the titanium silicide layer is reduced by the secondary heat treatment.

In the above two conventional methods for forming the titanium silicide layer, the heat treatment such as the lamp anneal was carried out in the nitrogen atmosphere in order to suppress over growth of the silicide layer and to use the salicide technique to advantage. During the above heat treatment, for example, the lamp anneal, not only the nitrogen atoms in the titanium nitride film 108 but also silicon atoms in the source/drain diffusion regions 106 and the polysilicon gate electrode 104 are diffused. Silicon atoms are vertically and laterally diffused from the source/drain diffusion regions 106 and some of the silicon atoms move toward the titanium film 107 extending over the field oxide film 102. The diffusion of the nitrogen atoms from the titanium nitride film 108 into the titanium film 107 is, however, faster than and prior to the diffusion of the silicon. The above diffusion of the nitrogen atoms forms a nitrogen containing titanium film 110 under the titanium nitride film 108 thereby promoting a nitriding reaction of titanium with nitrogen. This nitriding reaction appears over the field oxide film and is superior over any silicidation reaction of the over-diffused silicon atoms with the titanium atoms in the titanium film 107 positioned over the field oxide film 102. For that reason, no titanium silicidation reaction appears over the field oxide film 102. Namely, over growth of the titanium silicide layer is suppressed.

If, in accordance with the above conventional methods, the heat treatment is carried out in the presence of nitrogen or in the nitrogen containing atmosphere to supply nitrogen into the refractory metal nitride layer, then a supply of nitrogen atoms into the refractory metal nitride film from the atmosphere may prevent any reduction in concentration of nitrogen existing in the titanium nitride layer during the heat treatment. The heat treatment in the presence of nitrogen further promotes and allows an excess amount of nitrogen atoms to diffuse and approach in the vicinity of the interface of the titanium layer to the source/drain diffusion layers by the heat treatment. Since the bonding reaction of nitrogen with silicon does take precedence over silicidation reaction between the refractory metal and silicon, a certain amount of the nitrogen atoms having been diffused and approached in the vicinity of the interface between the titanium layer and the source/drain diffusion layers does prevent the intended silicidation reaction of refractory metal atoms with silicon atoms. This phenomenon in question will become remarkable as the thickness of the first layer is thin. This means it difficult to do a substantial scaling down of the device.

In order to settle the above problem with over growth of the silicide layer, it had been proposed to form a metal nitride layer over the metal layer wherein the metal nitride layer contains an excess amount of nitrogen to cause a sufficient nitrogen diffusion for suppressing any over growth of the silicide layer. This technique is disclosed in the U.S. Pat. No. 5,550,084 filed on Jan. 17, 1995. Since the metal nitride layer contains such excess amount of nitrogen, there is no need to further supply nitrogen from atmosphere in the heat treatment for silicidation. Excess diffusion of nitrogen into the titanium layer may, however, suppress not only unintended silicidation over the field oxide film but also the intended silicidation over the source/drain diffusion regions and over the polysilicon gate electrode. For this reason, it is required to precisely control the amount of diffused nitrogen and a nitrogen diffusion depth. Dependence upon the nitrogen-supply from the atmosphere in the heat treatment to ensure the sufficient amount of nitrogen for suppressing the over growth of the silicide layer makes it difficult to do the required precise control of the amount of diffused nitrogen and diffusion depth. For which reason, in accordance with the above U.S. Patent, a sufficiently large amount of nitrogen had previously been introduced into the metal layer before the heat treatment is carried out in the absence of nitrogen for allowing a necessary nitrogen diffusion into the metal layer.

Whereas the above described U.S. Patent is suitable for suppressing the over growth of the silicide layer, the same is, however, unsuitable in the light of difficulty to reduce thickness of the metal or refractory metal layer for scaling down of the semiconductor device. The above conventional method disclosed in the above U.S. Patent utilizes the excess amount of nitrogen contained in the titanium nitride layer for suppressing the over growth of the silicide layer. This, however, means that the nitrogen diffusion rate is higher and the nitrogen diffusion depth is deeper. This further means that if the titanium nitride layer contains excess amount of nitrogen, it is difficult to have the nitrogen diffused at a low diffusion rate and diffused shallower. This makes it difficult to reduce the thickness of the metal or refractory metal layer into which the nitrogen is diffused from the nitrogen containing metal layer. Namely, if the metal layer or the refractory metal layer has a reduced thickness for allowing and promoting the required scaling down of the semiconductor device and if the nitrogen containing metal or refractory metal layer overlying the refractory metal layer contains excess amount of nitrogen as described in the above U.S. Patent, then nitrogen may diffuse and approach in the vicinity of the interface of the refractory metal layer and silicon surface by the heat treatment for the purpose of silicidation. Since the excess amount of nitrogen is contained in the nitrogen containing refractory metal layer, the nitrogen diffusion rate is high and the nitrogen diffusion depth is deep, for which reason a certain amount of the nitrogen atoms have been diffused and approached in the vicinity of the interface between the titanium layer and the source/drain diffusion layers although the intended silicidation reaction of refractory metal atoms with silicon atoms is not yet initiated. As a result, no silicidation reaction will appear by the heat treatment by the excess diffusion of nitrogen. This phenomenon in question becomes remarkable as the thickness of the first layer is reduced. This means it is difficult to do a substantial scaling down of the device as long as the conventional technique as described in the above U.S. Patent.

In addition, the prior art disclosed in the above described U.S. Patent has a further disadvantage. If the silicidation reaction appears on a region surrounded by an insulation film, a silicide layer is likely to be immersed into the silicon surface due to a silicon diffusion caused by the silicidation reaction. This immersion of the silicide layer into the silicon surface causes a deformation of the refractory metal layer and the nitrogen containing refractory metal layer. Structural strengths of the both layers affect the immersion of the silicide layer into the silicon surface. High structural strengths of the refractory metal layer and the nitrogen containing refractory metal layer do suppress deformation of those layers caused by the silicidation reaction. Thus, the high structural strengths of the refractory metal layer and the nitrogen containing refractory metal layer suppress the silicidation reaction. By contrast, low structural strengths of the refractory metal layer and the nitrogen containing refractory metal layer do not suppress deformations of those layers caused by the silicidation reaction. Thus, the low structural strengths of the refractory metal layer and the nitrogen containing refractory metal layer allows the silicidation reaction. By the way, the structural strength of the refractory metal nitride layer or the nitrogen containing refractory metal layer depends upon the contents of nitrogen or the nitrogen compositional ratio to the refractory metal. If the nitrogen compositional ratio to the refractory metal is high as disclosed in the above U.S. Patent, then the structural strength of the refractory metal nitride layer is also high whereby the silicidation reaction is suppressed. If, however, contrary to the above U.S. Patent, the nitrogen compositional ratio to the refractory metal were low, the structural strength of the refractory metal nitride layer is also low whereby the silicidation reaction is not suppressed.

Further, the prior art disclosed in the above described U.S. Patent has a further more disadvantage in the use of a single heat treatment cycle at a high temperature of not less 800° C. for causing silicidation reaction and subsequent phase transition C49 structure into C54 structure. As the temperature of the heat treatment is risen up, the nitrogen diffusion rate is increased thereby the nitrogen diffusion depth becomes deep. This makes it difficult to do shallow diffusion of the nitrogen and if the refractory metal is thin for the purpose of the scaling down of the semiconductor device, then it is difficult to cause silicidation reaction. If the reduction in the thickness of the refractory metal layer is required for the scaling down of the semiconductor device, it is difficult to apply the above conventional technique for forming the nitrogen rich refractory metal layer over the refractory metal layer.

The above described conventional methods are, however, not suitable for the practical and actual requirement for sufficient reproducibility and reduction in thickness of the refractory metal layer for the purpose of scaling down of the semiconductor integrated circuit device.

SUMMARY OF THE INVENTION

Accordingly, it is an object of the present invention to provide a novel method for forming a refractory metal silicide layer free from any problems as described above.

It is a further object of the present invention to provide a novel method for forming a refractory metal silicide layer suitable for a scaled down semiconductor device.

It is a still further object of the present invention to provide a novel method for forming a refractory metal silicide layer having a reduced sheet resistance.

It is yet a further object of the present invention to provide a novel method for forming a refractory metal silicide layer at a high yield.

It is a further more object of the present invention to provide a novel method for forming a refractory metal silicide layer by heat treatments at relatively low temperatures to prevent any thermal deterioration of device performances.

It is moreover object of the present invention to provide a novel method for forming a refractory metal silicide layer without any over growth.

It is still more object of the present invention to provide a novel method for facilitating formation of a refractory metal silicide layer having a uniform and precise thickness.

It is yet more object of the present invention to provide a novel method for facilitating control of nitrogen diffusion in heat treatment to form a refractory metal silicide layer.

It is another object of the present invention to provide a novel method for forming a MOS field effect transistor with a refractory metal silicide layer free from any problems as described above.

It is further another object of the present invention to provide a novel method for forming a MOS field effect transistor with a refractory metal silicide layer suitable for a scaled down semiconductor device.

It is still further another object of the present invention to provide a novel method for forming a MOS field effect transistor with a refractory metal silicide layer having a reduced sheet resistance.

It is yet further another object of the present invention to provide a novel method for forming a MOS field effect transistor with a refractory metal silicide layer at a high yield.

It is further more another object of the present invention to provide a novel method for forming a MOS field effect transistor with a refractory metal silicide layer which is formed by heat treatments at relatively low temperatures to prevent any thermal deterioration of device performances.

It is moreover another object of the present invention to provide a novel method for forming a MOS field effect transistor with a refractory metal silicide layer without any over growth.

It is still more another object of the present invention to provide a novel method for a MOS field effect transistor by facilitated formation of a refractory metal silicide layer having a uniform and precise thickness.

It is yet more another object of the present invention to provide a novel method for a MOS field effect transistor by facilitated control of nitrogen diffusion in heat treatment to form a refractory metal silicide layer.

In addition, it is an object of the present invention to provide a novel refractory metal silicide layer free from any problems as described above.

It is an additional object of the present invention to provide a novel refractory metal silicide layer suitable for a scaled down semiconductor device.

It is a still additional object of the present invention to provide a novel refractory metal silicide layer having a reduced sheet resistance.

It is yet an additional object of the present invention to provide a novel refractory metal silicide layer at a high yield.

It is still more additional object of the present invention to provide a novel refractory metal silicide layer by heat treatments at relatively low temperatures to prevent any thermal deterioration of device performances.

It is moreover additional object of the present invention to provide a novel refractory metal silicide layer without any over growth.

It is still further additional object of the present invention to provide a novel refractory metal silicide layer having a uniform and precise thickness.

It is yet further additional object of the present invention to provide a novel refractory metal silicide layer formed by control of nitrogen diffusion in heat treatment.

It is another additional object of the present invention to provide a novel MOS field effect transistor with a refractory metal silicide layer free from any problems as described above.

It is further another additional object of the present invention to provide a novel MOS field effect transistor with a refractory metal silicide layer suitable for a scaled down semiconductor device.

It is still further another additional object of the present invention to provide a novel MOS field effect transistor with a refractory metal silicide layer having a reduced sheet resistance.

It is yet further another additional object of the present invention to provide a novel MOS field effect transistor with a refractory metal silicide layer at a high yield.

It is further more another additional object of the present invention to provide a novel MOS field effect transistor with a refractory metal silicide layer which is formed by heat treatments at relatively low temperatures to prevent any thermal deterioration of device performances.

It is moreover another additional object of the present invention to provide a novel MOS field effect transistor with a refractory metal silicide layer without any over growth.

It is still more another additional object of the present invention to provide a novel MOS field effect transistor by facilitated formation of a refractory metal silicide layer having a uniform and precise thickness.

It is yet more another additional object of the present invention to provide a novel MOS field effect transistor by facilitated control of nitrogen diffusion in heat treatment to form a refractory metal silicide layer.

The above and other objects, features and advantages of the present invention will be apparent from the following descriptions.

The present invention provides a method for forming a refractory metal silicide layer on a silicon surface. The method comprises the following steps. A first layer made of a refractory metal is formed on the silicon surface. A second layer is formed which extends over the first layer. The second layer may be made of the same refractory metal as the first layer and contains nitrogen, wherein a ratio in composition of nitrogen to the refractory metal is less than 1:1. The silicon surface and the first and second layers are then subjected to a heat treatment in a nitrogen free atmosphere having a pressure of not less than ultra high vacuum to form a refractory metal silicide layer on an interface between the silicon surface and the first layer.

The present invention provides a method for forming a refractory metal silicide layer on a silicon surface. The method comprises the following steps. A first layer made of a refractory metal is formed on the silicon surface, wherein the first layer has a thickness in the range of approximately 10–25 nanometers. A second layer is formed, which extends over the first layer, and is made of a nitrogen containing refractory metal. The silicon surface and the first and second layers are subjected to a heat treatment in a nitrogen free atmosphere having a pressure of not less than ultra high vacuum to form a refractory metal silicide layer on an interface between the silicon surface and the first layer.

The present invention provides a method for forming a refractory metal silicide layer on a silicon surface. The method comprises the following steps. A first layer made of a refractory metal is formed on the silicon surface, wherein the first layer has a thickness in the range of approximately 10–25 nanometers. A second layer is formed which extends over the first layer and is made of a nitrogen containing refractory metal. The silicon surface and the first and second layers are subjected to a heat treatment in an argon gas atmosphere to form a refractory metal silicide layer on an interface between the silicon surface and the first layer.

The present invention provides a method for forming a refractory metal silicide layer on a silicon surface. The method comprises the following steps. A first layer made of a refractory metal is formed on the silicon surface. A second layer is formed which extends over the first layer and is made of a nitrogen containing refractory metal. The silicon surface and the first and second layers are subjected to a heat treatment in an argon gas atmosphere to form a refractory metal silicide layer on an interface between the silicon surface and the first layer.

BRIEF DESCRIPTIONS OF THE DRAWINGS

Preferred embodiments of the present invention will be described in detail with reference to the accompanying drawings.

DESCRIPTION OF THE PREFERRED EMBODIMENT

Figure 1A:
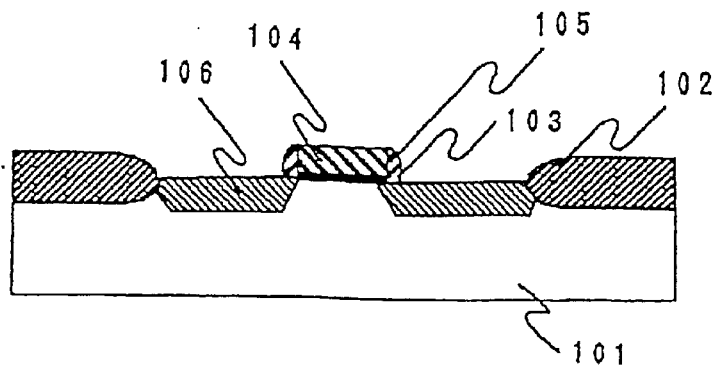
FIGS. 1A through 1E are fragmentary cross sectional elevation views illustrative of MOS field effect transistors in sequential processes involved in the conventional fabrication method thereof.
Figure 1B:
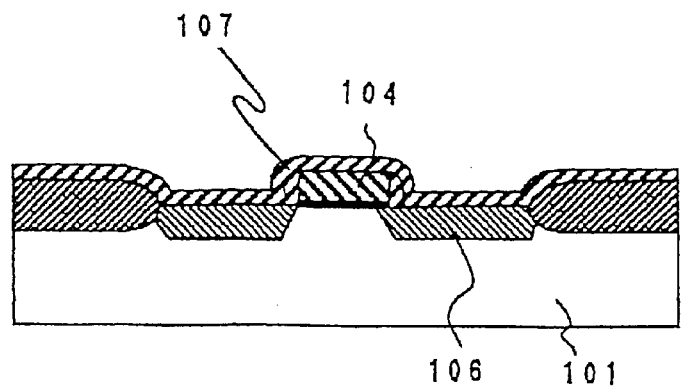
Figure 1C:
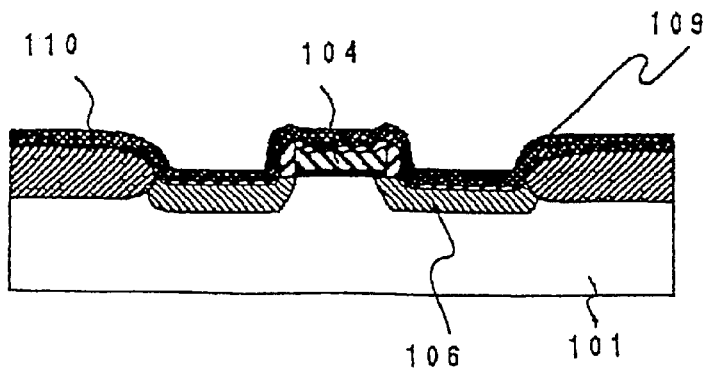
Figure 1D:
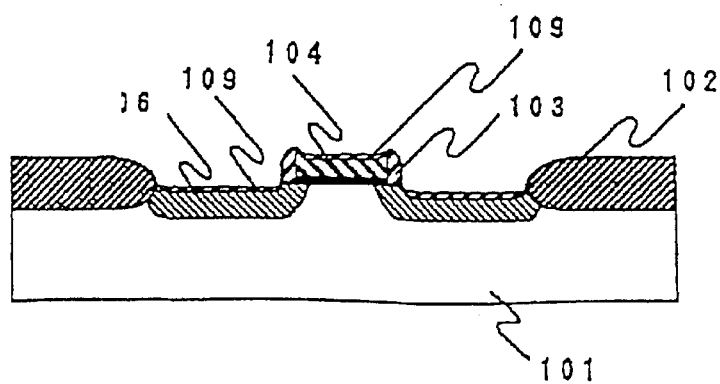
Figure 1E:
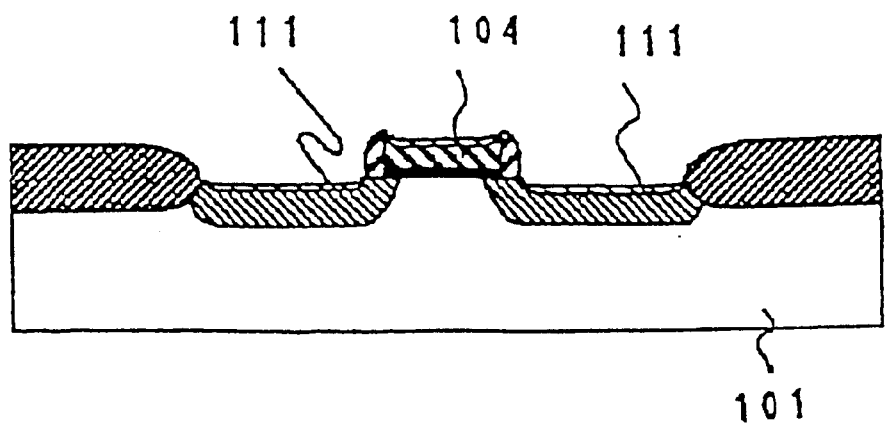
Figure 2A:
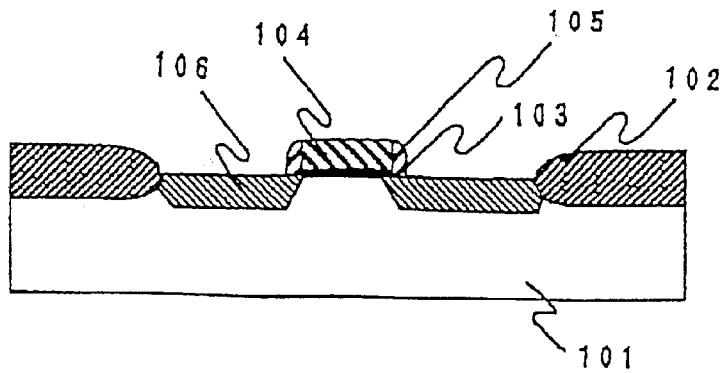
FIGS. 2A through 2E are fragmentary cross sectional elevation views illustrative of MOS field effect transistors in sequential processes involved in the other conventional fabrication method thereof.
Figure 2B:
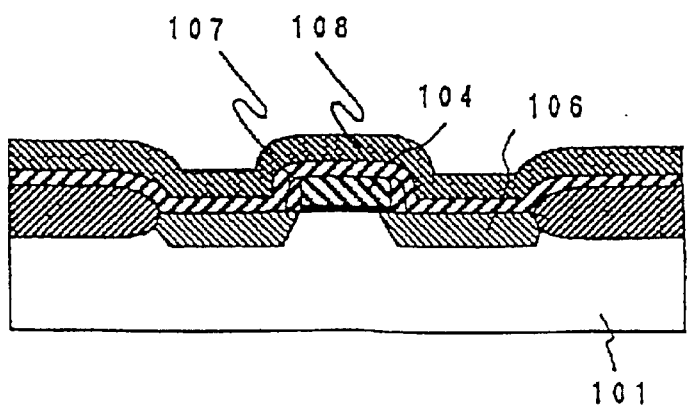
Figure 2C:
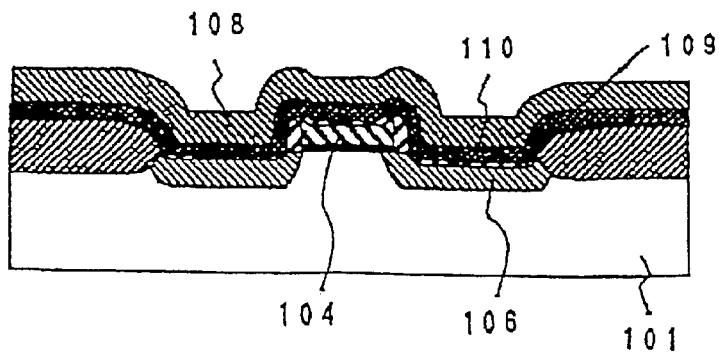
Figure 2D:
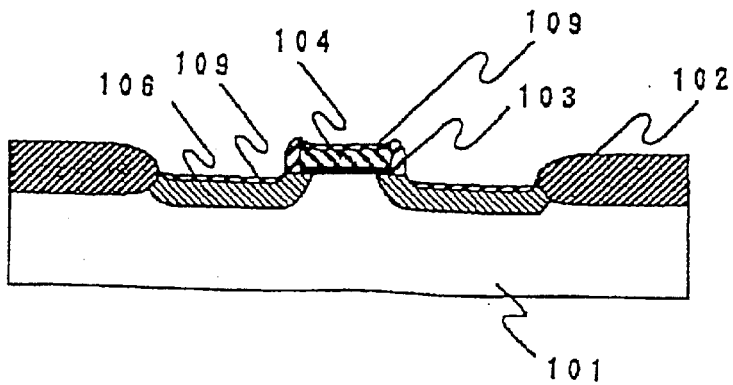
Figure 2E:
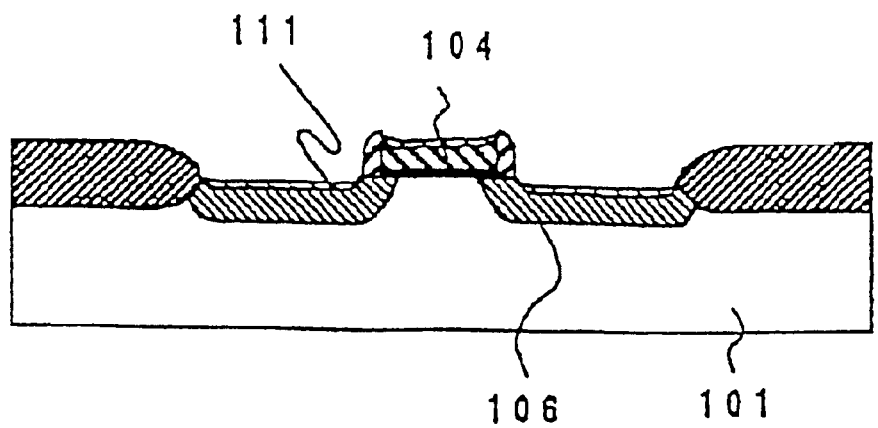

The present invention provides a method for forming a refractory metal silicide layer on a silicon surface. The method comprises the following steps. A first layer made of a refractory metal is formed on the silicon surface. A second layer is formed which extends over the first layer. The second layer may be made of the same refractory metal as the first layer and contains nitrogen, wherein a ratio in composition of nitrogen to the refractory metal is less than 1:1. The silicon surface and the first and second layers are then subjected to a heat treatment in a nitrogen free atmosphere having a pressure of not less than ultra high vacuum to form a refractory metal silicide layer on an interface between the silicon surface and the first layer.

It is important for the present invention that a ratio in composition of nitrogen to the refractory metal is less than 1:1, or nitrogen poor composition is desired for the second layer made of refractory metal nitride layer. It is also important for the present invention that the heat treatment for forming the refractory metal silicide layer on the interface between the silicon surface and the first layer is carried out in the absence of nitrogen or in the nitrogen free atmosphere having a pressure of not less than ultra high vacuum in order to prevent nitrogen from supplying to the second layer made of the refractory metal nitride. The above both conditions, namely the lower compositional ratio of nitrogen to the refractory metal and the heat treatment in the nitrogen free atmosphere or in vacuum are preferable in order to prevent nitrogen atoms form approaching the interface of the refractory metal layer and from suppressing silicidation resulted from the bonding reaction between silicon atoms and refractory metal atoms on the interface between the refractory metal layer and the silicon surface.

If, contrary to the present invention, the heat treatment is carried out in the presence of nitrogen or in the nitrogen containing atmosphere to supply nitrogen into the refractory metal nitride layer even the nitrogen compositional ratio to the refractory metal is low or the nitrogen poor refractory metal nitride layer is formed over the nitrogen free refractory metal layer, then a supply of nitrogen atoms into the refractory metal nitride film from the atmosphere may prevent any reduction in concentration of nitrogen existing in the second layer even during the heat treatment and further promotes and allows an excess amount of nitrogen atoms to diffuse and approach in the vicinity of the interface of the first layer to the silicon surface by the heat treatment. Since the bonding reaction of nitrogen with silicon does take precedence over silicidation reaction between the refractory metal and silicon, a certain amount of the nitrogen atoms having been diffused and approached in the vicinity of the interface between the first layer and the silicon surface does prevent the intended silicidation reaction of refractory metal atoms with silicon atoms. This phenomenon in question will become remarkable as the thickness of the first layer is thin. This means it is difficult to do a substantial scaling down of the device.

If, however, in accordance with the present invention, the heat treatment is carried out in the absence of nitrogen namely in the nitrogen free atmosphere, or an argon gas atmosphere to prevent any further supply of nitrogen into the refractory metal nitride layer and further if the nitrogen compositional ratio to the refractory metal is low or the nitrogen poor refractory metal nitride layer is formed over the nitrogen free refractory metal layer, then a relatively small amount of nitrogen atoms having pre-existed in the second layer is diffused by the heat treatment into the first layer made of the refractory metal. The diffused nitrogen atoms are, however, unlikely to move into positions in the vicinity of the interface between the first layer and the silicon surface. Namely, as a result of the heat treatment, the concentration of nitrogen atoms in the second layer made of the refractory metal nitride is reduced, and the diffusion depth of the nitrogen atoms is relatively shallow. In other words, the nitrogen atoms are kept from approaching the interface of the refractory metal layer to the silicon surface thereby allowing and promoting the intended silicidation even if the thickness of the first layer is extremely thin to comply with the requirement for considerable scaling down of the semiconductor device. The above two important conditions for promoting the silicidation, therefore, allow a considerable scaling down of the semiconductor devices such as MOS field effect transistors. The above two conditions for promoting the silicidation may further allow a relatively low temperature heat treatment, for example, at a temperature less than approximately 750° C. for causing the intended silicidation without any excess silicidation namely over growth of refractory metal silicide layer over unintended region such as field oxide films.

If, contrary to the present invention, the heat treatment were carried out at a higher temperature such as 800° C. or above for silicidation, then there may be allowed any excess silicidation or over growth of refractory metal silicide layer over unintended region such as a passive region, for example, over field oxide films. The refractory metal silicide layer grown over the isolation film such as field oxide film in the MOS transistor may cause a leakage of current.

In addition, if the silicidation reaction appears on a region surrounded by an insulation film, a silicide layer is likely to be sunk into the silicon surface due to a silicon diffusion caused by the silicidation reaction. This immersion of the silicide layer into the silicon surface causes a deformation of the first and second layers overlying the silicide layer. Structural strengths of the first and second layers affect the immersion of the silicide layer into the silicon surface. High structural strengths of the first and second layers do suppress deformation of the first and second layers caused by the silicidation reaction. Thus, the high structural strengths of the first and second layers suppresses the silicidation reaction. By contrast, low structural strengths of the first and second layers do not suppress deformations of the first and second layers caused by the silicidation reaction. Thus, the low structural strengths of the first and second layers facilitate the silicidation reaction. The structural strength of the refractory metal nitride layer depends upon the contents of nitrogen or the nitrogen compositional ratio to the refractory metal. If the nitrogen compositional ratio to the refractory metal is high, the structural strength of the refractory metal nitride layer is also high whereby the silicidation reaction is suppressed. By contrast if the nitrogen compositional ratio to the refractory metal is low, the structural strength of the refractory metal nitride layer is also low whereby the silicidation reaction is not suppressed. If, in accordance with the present invention, the nitrogen compositional ratio to the refractory metal is low or the nitrogen poor refractory metal nitride layer is formed over the nitrogen free refractory metal layer, then the structural strength of the refractory metal nitride layer is also low whereby the silicidation reaction is not suppressed.

For the above present invention, it is also important that the above nitrogen free atmosphere is an argon gas atmosphere. Otherwise, vacuum is also available. Theoretically, other inert gases such as neon and helium seem to be available. Actually, however, only the argon gas is suitable whilst other inert gases are unsuitable. The argon gas has a weight relatively closer to that of the air. The argon gas is much heavier than neon and helium. The heat treatment, for example, annealing is carried out in a chamber filled with the argon gas atmosphere, wherein the laminated first and second layers over silicon are placed in the chamber. When the argon gas atmosphere is heated up by the annealing, a convection of the argon gas appears but the argon gas can surround the laminated first and second layers due to its sufficient atomic weight to thereby keep the nitrogen free atmosphere around the laminated first and second layers. By contrast, neon and helium are too light to remain around the laminated first and second layers when heated up, for which reason they seem unsuitable as an atmosphere to be used for the heat treatment for silicidation.

If, in accordance with the present invention, the heat treatment is carried out in the absence of nitrogen namely in the argon gas atmosphere to prevent any further supply of nitrogen into the refractory metal nitride layer during the heat treatment for silicidation, then a relatively small and limited amount of nitrogen atoms having pre-existed in the second layer is diffused by the heat treatment into the first layer made of the refractory metal. The diffused nitrogen atoms are, however, unlikely to move into positions in the vicinity of the interface between the first layer and the silicon surface. Namely, as a result of the heat treatment, the concentration of nitrogen atoms in the second layer made of the refractory metal nitride is reduced, and the diffusion depth of the nitrogen atoms is relatively shallow. In other words, the nitrogen atoms are kept from approaching the interface of the refractory metal layer to the silicon surface thereby allowing and promoting the intended silicidation even if the thickness of the first layer is extremely thin to comply with the requirement for considerable scaling down of the semiconductor device. The argon atmosphere condition for promoting the silicidation, therefore, allow a considerable scaling down of the semiconductor devices such as MOS field effect transistors. The above argon atmosphere condition for promoting the silicidation may further allow a relatively low temperature heat treatment, for example, at a temperature less than approximately 750° C. for causing the intended silicidation without any excess silicidation namely over growth of refractory metal silicide layer over unintended region such as field oxide films.

If, contrary to the present invention, the heat treatment were carried out at a higher temperature such as 800° C. or above for silicidation, then there may be allowed any excess silicidation or over growth of refractory metal silicide layer over unintended region such as a passive region, for example, over field oxide films. The refractory metal silicide layer grown over the isolation film such as field oxide film in the MOS transistor may cause a leakage of current.

If, contrary to the present invention, the heat treatment is carried out in the presence of nitrogen or in the nitrogen containing atmosphere to supply nitrogen into the refractory metal nitride layer, then a supply of nitrogen atoms into the refractory metal nitride film from the atmosphere may prevent any reduction in concentration of nitrogen existing in the second layer even during the heat treatment and further promotes and allows nitrogen atoms to diffuse and approach in the vicinity of the interface of the first layer to the silicon surface by the heat treatment. Since the bonding reaction of nitrogen with silicon does take precedence over silicidation reaction between the refractory metal and silicon, a certain amount of the nitrogen atoms having been diffused and approached in the vicinity of the interface between the first layer and the silicon surface does prevent the intended silicidation reaction of refractory metal atoms with silicon atoms. This phenomenon in question will become remarkable as the thickness of the first layer is thin. This means it is difficult to do a substantial scaling down of the device. From the above descriptions, a great deal of advantages in use of the argon atmosphere can be appreciated.

In addition, the use of the argon gas atmosphere for the heat treatment for silicidation provides a further advantage in lower price of argon than neon and helium whereby the manufacturing cost of the semiconductor device is also reduced.

The method may further include the following steps. The first and second layers are removed to leave the refractory metal silicide layer on the silicon surface before the refractory metal silicide layer is subjected to a secondary heat treatment at a higher temperature than the prior heat treatment in an atmosphere free of nitrogen to cause a phase transition of the refractory metal silicide layer thereby reducing a resistivity of the refractory metal silicide layer. The first and second layers may be removed by use of a chemical in which hydrogen peroxide is mixed in an anmonia solution. If the refractory metal is titanium, then the silicide layer has a C49 structure prior to the secondary heat treatment. When the C49 structure titanium silicide is subjected to the secondary heat treatment at a temperature higher than that of the prior heat treatment for silicidation, for example, at approximately 800° C. for about 10 seconds, then a phase transition of the titanium silicide appears and the C49 structure is changed into a C54 structure having a reduced resistivity. As a result, the phase transition can reduce the sheet resistance of the titanium silicide layer.

The above secondary heat treatment for causing the phase transition is preferably carried out in an argon gas atmosphere because if the secondary heat treatment is carried out in the argon atmosphere, then the transition temperature at which the phase transition of the refractory metal, for example, from C49 structured titanium silicide to C54 structured titanium silicide is lower than when the nitrogen gas atmosphere is used. Further, if the secondary heat treatment is carried out in the argon atmosphere and if the refractory metal layer such as titanium layer has a reduced thickness, then no transition temperature rise appears and the transition temperature remains low. Such low temperature heat treatment makes the semiconductor device free from any performance deterioration due to high temperature treatment.

The refractory metal is preferably titanium even any other refractory metals are available such as tungsten and molybdenum and others. If the refractory metal is titanium, then the second layer may comprise a $Ti_xN_{1-x}$ layer formed by depositing titanium nitride on the first layer, where 1>x>0.5. Alternatively, the second layer may comprise a $Ti_2N$ layer formed by sputtering a target of $Ti_2N$ in the absence of nitrogen.

The first layer has a thickness of not more than 30 nanometers. In the light of a possible reduction in thickness of the layers for scaling down of the semiconductor device, it is preferable that the first layer made of refractory metal such as titanium has a thickness in the range of about 10–25 nanometers and the second layer has a thickness of not more than 20 nanometers. If the first layer made of refractory metal such as titanium has a thickness in the range of about 10–25 nanometers, then the thickness of the silicide layer is in the range of about 15–40 nanometers. The thickness of about 10 nanometers is the critical thickness for allowing a formation of a certain titanium silicide layer in consideration of a time delay of initiation of the silicidation from nitrogen thermal diffusion from the second layer through the first layer toward the interface of the first layer and the silicon surface. If the thickness of the first layer is apparently smaller than the above critical thickness of about 10 nanometers, then nitrogen atoms have been diffused and already arrived at or around the interface and then the diffused nitride atoms have been bonded with silicon atoms on the silicon surface, although the intended silicidation is not yet initiated. As a result, no silicidation can be obtained. The above range in thickness of the first layer made of refractory metal such as titanium is important in the light of allowing not only the refractory metal silicidation but also a possible reduction in thickness of the layer for achieving the ultimate scaling down of the semiconductor device such as MOS field effect transistors.

The present invention also provides a multi-layer structure comprising a silicon surface and a refractory metal silicide layer which extends over the silicon surface, wherein the refractory metal silicide layer is formed by a method comprising the following steps. A first layer made of a refractory metal is formed on the silicon surface. A second layer is formed, which extends over the first layer. The second layer is made of a nitrogen containing refractory metal, wherein a ratio in composition of nitrogen to the refractory metal is less than 1:1. The silicon surface and the first and second layers are then subjected to a heat treatment in a nitrogen free atmosphere having a pressure of not less than ultra high vacuum to form a refractory metal silicide layer on an interface between the silicon surface and the first layer. The first and second layers are removed to leave the refractory metal silicide layer on the silicon surface.

The available nitrogen free atmosphere is, for example, an argon gas atmosphere at a temperature of less than about 750° C.

When the refractory metal is titanium, the refractory metal nitride layer may be $Ti_xN_{1-x}$, where 1>x>0.5.

The refractory metal silicide layer may further be subjected to a secondary heat treatment in an atmosphere free of nitrogen to cause a phase transition of the refractory metal silicide layer thereby reducing a resistivity of the refractory metal silicide layer. The secondary heat treatment is carried out in an argon gas atmosphere at a temperature higher than that of the heat treatment for forming the refractory metal silicide layer.

The second layer may comprise a $Ti_xN_{1-N}$ layer formed by depositing titanium nitride on the first layer, where 1>x>0.5. Alternatively, the second layer may comprise a $Ti_xN_{1-x}$ layer formed by an ion implantation of nitrogen atoms into an upper region of the first layer, where 1>x>0.5.

The first layer has a thickness in the range of approximately 10–25 nanometers, and the second layer has a thickness of not more than 20 nanometers. If the first layer made of refractory metal such as titanium has a thickness in the range of about 10–25 nanometers, then the thickness of the silicide layer is in the range of about 15–40 nanometers.

The subject matter of the above second invention is substantially the same as the first invention, for which reason the second invention can be well understood from the above detailed descriptions of the first invention.

The present invention also provides a multi-layer structure comprising a refractory metal silicide layer which extends over a silicon surface, a first layer which extends over the refractory metal silicide layer and is made of a refractory metal, and a second layer which extends over the first layer and is made of a nitrogen containing refractory metal, wherein a ratio in composition of nitrogen to the refractory metal is less than 1:1. The refractory metal silicide layer is formed by subjecting the silicon surface and the first and second layers to a heat treatment in a nitrogen free atmosphere having a pressure of not less than ultra high vacuum to form the refractory metal silicide layer on an interface between the silicon surface and the first layer.

The nitrogen free atmosphere is, for example, an argon gas atmosphere at a temperature of less than about 750° C.

It is preferable that the refractory metal is titanium and the refractory metal nitride layer is $Ti_xN_{1-x}$, where 1>x>0.5.

The second layer may comprise a $Ti_xN_{1-x}$ layer formed by depositing titanium nitride on the first layer, where 1>x>0.5. The second layer may comprise a $Ti_xN_{1-x}$ layer formed by an ion implantation of nitrogen atoms into an upper region of the first layer, where 1>x>0.5.

The first layer has a thickness in the range of approximately 10–25 nanometers, and the second layer has a thickness of not more than 20 nanometers. If the first layer made of refractory metal such as titanium has a thickness in the range of about 10–25 nanometers, then the thickness of the silicide layer is in the range of about 15–40 nanometers.

The subject matter of the above third invention is substantially the same as the first invention, for which reason the third invention can be well understood from the above detailed descriptions of the first invention.

The present invention also provides a method for fabricating a semiconductor device. The method comprises the following steps. Field oxide films and a gate oxide film are formed on a surface of a silicon substrate. A gate electrode is selectively formed on a predetermined area of the gate oxide film. Side wall oxide films are formed on opposite sides of the gate electrode. There is carried out an ion implantation of an impurity having an opposite conductivity type to a conductivity type of the silicon substrate into the silicon substrate by use of the field oxide films, the side wall oxide films and the gate electrode as masks to form self-aligned source and drain regions. A first layer made of a refractory metal is formed on an entire surface of the silicon surface. A second layer is formed which extends over the first layer, the second layer being made of a nitrogen containing refractory metal, wherein a ratio in composition of nitrogen to the refractory metal is less than 1:1. The silicon surface and the first and second layers are subjected to a heat treatment in a nitrogen free atmosphere having a pressure of not less than ultra high vacuum to form a refractory metal silicide layer on an interface between the silicon surface and the first layer. The first and second layers are removed to leave the refractory metal silicide layer on the silicon surface. The refractory metal silicide layer is further subjected to a secondary heat treatment in the nitrogen free atmosphere to cause a phase transition of the refractory metal silicide layer thereby reducing a resistivity of the refractory metal silicide layer.

The nitrogen free atmosphere is, for example, an argon gas atmosphere at a temperature of less than about 750° C.

The refractory metal may be titanium and the refractory metal nitride layer may be $Ti_xN_{1-x}$, where 1>x>0.5.

The secondary heat treatment is carried out at a temperature higher than that of the heat treatment for forming the refractory metal silicide layer.

The second layer may comprise a $Ti_xN_{1-x}$ layer formed by depositing titanium nitride on the first layer, where 1>x>0.5. The second layer may comprise a $Ti_xN_{1-x}$ layer formed by an ion implantation of nitrogen atoms into an upper region of the first layer, where 1>x>0.5.

The first layer has a thickness in the range of approximately 10–25 nanometers, and the second layer has a thickness of not more than 20 nanometers. If the first layer made of refractory metal such as titanium has a thickness in the range of about 10–25 nanometers, then the thickness of the silicide layer is in the range of about 15–40 nanometers.

The subject matter of the above fourth invention is substantially the same as the first invention, for which reason the fourth invention can be well understood from the above detailed descriptions of the first invention.

The present invention also provides a method for forming a refractory metal silicide layer on a silicon surface. The method comprises the following steps. A first layer made of a refractory metal is formed on the silicon surface, wherein the first layer has a thickness in the range of approximately 10–25 nanometers. A second layer is formed, which extends over the first layer, and is made of a nitrogen containing refractory metal. The silicon surface and the first and second layers are subjected to a heat treatment in a nitrogen free atmosphere having a pressure of not less than ultra high vacuum to form a refractory metal silicide layer on an interface between the silicon surface and the first layer.

In the light of a possible reduction in thickness of the layers for scaling down of the semiconductor device, it is preferable that the first layer made of refractory metal such as titanium has a thickness in the range of about 10–25 nanometers and the second layer has a thickness of not more than 20 nanometers. The thickness of about 10 nanometers is the critical thickness for allowing a formation of a certain titanium silicide layer in consideration of a time delay of initiation of the silicidation from nitrogen thermal diffusion from the second layer through the first layer toward the interface of the first layer and the silicon surface. If the thickness of the first layer is apparently smaller than the above critical thickness of about 10 nanometers, then nitrogen atoms have been diffused and already arrived at or around the interface and then the diffused nitride atoms have been bonded with silicon atoms on the silicon surface, although the intended silicidation is not yet initiated. As a result, no silicidation can be obtained. The above range in thickness of the first layer made of refractory metal such as titanium is important in the light of allowing not only the refractory metal silicidation but also a possible reduction in thickness of the layer for achieving the ultimate scaling down of the semiconductor device such as MOS field effect transistors.

The nitrogen free atmosphere is, for example, an argon gas atmosphere at a temperature of less than about 750° C. For the above present invention, it is important that the above nitrogen free atmosphere is an argon gas atmosphere. Otherwise, vacuum is also available. Theoretically, other inert gases such as neon and helium seem to be available. Actually, however, only the argon gas is suitable whilst other inert gases are unsuitable. The argon gas has a weight relatively closer to that of the air. The argon gas is much heavier than neon and helium. The heat treatment, for example, annealing is carried out in a chamber filled with the argon gas atmosphere, wherein the laminated first and second layers over silicon are placed in the chamber. When the argon gas atmosphere is heated up by the annealing, a convection of the argon gas appears but the argon gas can surround the laminated first and second layers due to its sufficient weight to thereby keep the nitrogen free atmosphere around the laminated first and second layers. By contrast, neon and helium are too light to remain around the laminated first and second layers when heated up, for which reason they seem unsuitable as an atmosphere to be used for the heat treatment for silicidation.

If, in accordance with the present invention, the heat treatment is carried out in the absence of nitrogen namely in the argon gas atmosphere to prevent any further supply of nitrogen into the refractory metal nitride layer during the heat treatment for silicidation, then a relatively small and limited amount of nitrogen atoms having pre-existed in the second layer is diffused by the heat treatment into the first layer made of the refractory metal. The diffused nitrogen atoms are, however, unlikely to move into positions in the vicinity of the interface between the first layer and the silicon surface. Namely, as a result of the heat treatment, the concentration of nitrogen atoms in the second layer made of the refractory metal nitride is reduced, and the diffusion depth of the nitrogen atoms is relatively shallow. In other words, the nitrogen atoms are kept from approaching the interface of the refractory metal layer to the silicon surface thereby allowing and promoting the intended silicidation even if the thickness of the first layer is extremely thin to comply with the requirement for considerable scaling down of the semiconductor device. The argon atmosphere condition for promoting the silicidation, therefore, allow a considerable scaling down of the semiconductor devices such as MOS field effect transistors. The above argon atmosphere condition for promoting the silicidation may further allow a relatively low temperature heat treatment, for example, at a temperature less than approximately 750° C. for causing the intended silicidation without any excess silicidation namely over growth of refractory metal silicide layer over unintended region such as field oxide films.

If, contrary to the present invention, the heat treatment were carried out at a higher temperature such as 800° C. or above for silicidation, then there may be allowed any excess silicidation or over growth of refractory metal silicide layer over unintended region such as a passive region, for example, over field oxide films. The refractory metal silicide layer grown over the isolation film such as field oxide film in the MOS transistor may cause a leakage of current.

If, contrary to the present invention, the heat treatment is carried out in the presence of nitrogen or in the nitrogen containing atmosphere to supply nitrogen into the refractory metal nitride layer, then a supply of nitrogen atoms into the refractory metal nitride film from the atmosphere may prevent any reduction in concentration of nitrogen existing in the second layer even during the heat treatment and further promotes and allows nitrogen atoms to diffuse and approach in the vicinity of the interface of the first layer to the silicon surface by the heat treatment. Since the bonding reaction of nitrogen with silicon does take precedence over silicidation reaction between the refractory metal and silicon, a certain amount of the nitrogen atoms having been diffused and approached in the vicinity of the interface between the first layer and the silicon surface does prevent the intended silicidation reaction of refractory metal atoms with silicon atoms. This phenomenon in question will become remarkable as the thickness of the first layer is thin. This means it difficult to do a substantial scaling down of the device. From the above descriptions, a great deal of advantages in use of the argon atmosphere can be appreciated.

In addition, the use of the argon gas atmosphere for the heat treatment for silicidation provides a further advantage in lower price of argon than neon and helium whereby the manufacturing cost of the semiconductor device is also reduced.

The method may further include the following steps. The first and second layers are removed to leave the refractory metal silicide layer on the silicon surface before the refractory metal silicide layer is subjected to a secondary heat treatment at a higher temperature than the prior heat treatment in an atmosphere free of nitrogen to cause a phase transition of the refractory metal silicide layer thereby reducing a resistivity of the refractory metal silicide layer. The first and second layers may be removed by use of a chemical in which hydrogen peroxide is mixed in an anmonia solution. If the refractory metal is titanium, then the silicide layer has a C49 structure prior to the secondary heat treatment. When the C49 structure titanium silicide is subjected to the secondary heat treatment at a temperature higher than that of the prior heat treatment for silicidation, for example, at approximately 800° C. for about 10 seconds, then a phase transition of the titanium silicide appears and the C49 structure is changed into a C54 structure having a reduced resistivity. As a result, the phase transition can reduce the sheet resistance of the titanium silicide layer.

The above secondary heat treatment for causing the phase transition is preferably carried out in the argon gas atmosphere because if the secondary heat treatment is carried out in the argon atmosphere, then the transition temperature at which the phase transition of the refractory metal, for example, from C49 structured titanium silicide to C54 structured titanium silicide is lower than when the nitrogen gas atmosphere is used. Further, if the secondary heat treatment is carried out in the argon atmosphere and if the refractory metal layer such as titanium layer has a reduced thickness, then no transition temperature rise appears and the transition temperature remains low. Such low temperature heat treatment makes the semiconductor device free from any performance deterioration due to high temperature treatment.

The refractory metal is preferably titanium even any other refractory metals are available such as tungsten and molybdenum and others.

The present invention also provides a multi-layer structure comprising a silicon surface and a refractory metal silicide layer which extends over the silicon surface, wherein the refractory metal silicide layer is formed by a method comprising the following steps. A first layer made of a refractory metal is formed on the silicon surface, wherein the first layer has a thickness in the range of approximately 10–25 nanometers. A second layer is formed which extends over the first layer and is made of a nitrogen containing refractory metal. The silicon surface and the first and second layers are subjected to a heat treatment in a nitrogen free atmosphere having a pressure of not less than ultra high vacuum to form a refractory metal silicide layer on an interface between the silicon surface and the first layer. The first and second layers are then removed to leave the refractory metal silicide layer on the silicon surface.

The nitrogen free atmosphere is, for example, an argon gas atmosphere at a temperature of less than about 750° C.

The refractory metal is titanium and the refractory metal nitride layer is a titanium nitride layer.

The refractory metal silicide layer is further subjected to a secondary heat treatment in an atmosphere free of nitrogen, for example, in an argon gas atmosphere to cause a phase transition of the refractory metal silicide layer thereby reducing a resistivity of the refractory metal silicide layer. The secondary heat treatment is carried out at a temperature higher than that of the heat treatment for forming the refractory metal silicide layer.

The second layer may comprise a titanium nitride layer formed by depositing titanium nitride on the first layer. Alternatively, the second layer comprises a titanium nitride layer formed by an ion implantation of nitrogen atoms into an upper region of the first layer.

The second layer has a thickness of not more than 20 nanometers.

The subject matter of the above fourth invention is substantially the same as the first invention, for which reason the fourth invention can be well understood from the above detailed descriptions of the first invention.

The present invention also provides a multi-layer structure comprising a refractory metal silicide layer which extends over a silicon surface, a first layer which extends over the refractory metal silicide layer and is made of a refractory metal wherein the first layer has a thickness in the range of approximately 10–25 nanometers, and a second layer which extends over the first layer and is made of a nitrogen containing refractory metal. The refractory metal silicide layer is formed by subjecting the silicon surface and the first and second layers to a heat treatment in a nitrogen free atmosphere having a pressure of not less than ultra high vacuum to form the refractory metal silicide layer on an interface between the silicon surface and the first layer.

The nitrogen free atmosphere is an argon gas atmosphere, and the heat treatment is carried out at a temperature of less than about 750° C. The refractory metal may be titanium and the refractory metal nitride layer may be a titanium nitride layer.

The second layer may comprise a titanium nitride layer formed by depositing titanium nitride on the first layer. Alternatively, the second layer may comprise a titanium nitride layer formed by an ion implantation of nitrogen atoms into an upper region of the first layer. The second layer has a thickness of not more than 20 nanometers.

The subject matter of the above fourth invention is substantially the same as the first invention, for which reason the fourth invention can be well understood from the above detailed descriptions of the first invention.

The present invention also provides a method for fabricating a semiconductor device. The method comprises the following steps. Field oxide films and a gate oxide film are formed on a surface of a silicon substrate. A gate electrode is selectively formed on a predetermined area of the gate oxide film. Side wall oxide films are formed on opposite sides of the gate electrode. There is carried out an ion implantation of an impurity having an opposite conductivity type to a conductivity type of the silicon substrate into the silicon substrate by use of the field oxide films, the side wall oxide films and the gate electrode as masks to form self-aligned source and drain regions. A first layer made of a refractory metal is formed on an entire surface of the silicon surface, wherein the first layer has a thickness in the range of approximately 10–25 nanometers. A second layer is formed which extends over the first layer and is made of a nitrogen containing refractory metal. The silicon surface and the first and second layers are subjected to a heat treatment in a nitrogen free atmosphere having a pressure of not less than ultra high vacuum to form a refractory metal silicide layer on an interface between the silicon surface and the first layer. The first and second layers are removed to leave the refractory metal silicide layer on the silicon surface. The refractory metal silicide layer is subjected to a secondary heat treatment in the nitrogen free atmosphere to cause a phase transition of the refractory metal silicide layer thereby reducing a resistivity of the refractory metal silicide layer.

The nitrogen free atmosphere is, for example, an argon gas atmosphere. The heat treatment is carried out at a temperature of less than about 750° C.

The refractory metal may be titanium and the refractory metal nitride layer may be a titanium nitride layer.

The secondary heat treatment is carried out at a temperature higher than that of the heat treatment for forming the refractory metal silicide layer.

The second layer may comprise a titanium nitride layer formed by depositing titanium nitride on the first layer. Alternatively, the second layer may comprise a titanium nitride layer formed by an ion implantation of nitrogen atoms into an upper region of the first layer.

The second layer has a thickness of not more than 20 nanometers.

The subject matter of the above fourth invention is substantially the same as the first invention, for which reason the fourth invention can be well understood from the above detailed descriptions of the first invention.

The present invention also provides a method for forming a refractory metal silicide layer on a silicon surface. The method comprises the following steps. A first layer made of a refractory metal is formed on the silicon surface, wherein the first layer has a thickness in the range of approximately 10–25 nanometers. A second layer is formed which extends over the first layer and is made of a nitrogen containing refractory metal. The silicon surface and the first and second layers are subjected to a heat treatment in an argon gas atmosphere to form a refractory metal silicide layer on an interface between the silicon surface and the first layer.

In the light of a possible reduction in thickness of the layers for scaling down of the semiconductor device, it is preferable that the first layer made of refractory metal such as titanium has a thickness in the range of about 10–25 nanometers and the second layer has a thickness of not more than 20 nanometers. The thickness of about 10 nanometers is the critical thickness for allowing a formation of a certain titanium silicide layer in consideration of a time delay of initiation of the silicidation from nitrogen thermal diffusion from the second layer through the first layer toward the interface of the first layer and the silicon surface. If the thickness of the first layer is apparently smaller than the above critical thickness of about 10 nanometers, then nitrogen atoms have been diffused and already arrived at or around the interface and then the diffused nitride atoms have been bonded with silicon atoms on the silicon surface, although the intended silicidation is not yet initiated. As a result, no silicidation can be obtained. The above range in thickness of the first layer made of refractory metal such as titanium is important in the light of allowing not only the refractory metal silicidation but also a possible reduction in thickness of the layer for achieving the ultimate scaling down of the semiconductor device such as MOS field effect transistors.

The nitrogen free atmosphere is, for example, an argon gas atmosphere at a temperature of less than about 750° C. For the above present invention, it is important that the above nitrogen free atmosphere is an argon gas atmosphere. Otherwise, vacuum is also available. Theoretically, other inert gases such as neon and helium seem to be available. Actually, however, only the argon gas is suitable whilst other inert gases are unsuitable. The argon gas has a weight relatively closer to that of the air. The argon gas is much heavier than neon and helium. The heat treatment, for example, annealing is carried out in a chamber filled with the argon gas atmosphere, wherein the laminated first and second layers over silicon are placed in the chamber. When the argon gas atmosphere is heated up by the annealing, a convection of the argon gas appears but the argon gas can surround the laminated first and second layers due to its sufficient weight to thereby keep the nitrogen free atmosphere around the laminated first and second layers. By contrast, neon and helium are too light to remain around the laminated first and second layers when heated up, for which reason they seem unsuitable as an atmosphere to be used for the heat treatment for silicidation.

If, in accordance with the present invention, the heat treatment is carried out in the absence of nitrogen namely in the argon gas atmosphere to prevent any further supply of nitrogen into the refractory metal nitride layer during the heat treatment for silicidation, then a relatively small and limited amount of nitrogen atoms having pre-existed in the second layer is diffused by the heat treatment into the first layer made of the refractory metal. The diffused nitrogen atoms are, however, unlikely to move into positions in the vicinity of the interface between the first layer and the silicon surface. Namely, as a result of the heat treatment, the concentration of nitrogen atoms in the second layer made of the refractory metal nitride is reduced, and the diffusion depth of the nitrogen atoms is relatively shallow. In other words, the nitrogen atoms are kept from approaching the interface of the refractory metal layer to the silicon surface thereby allowing and promoting the intended silicidation even if the thickness of the first layer is extremely thin to comply with the requirement for considerable scaling down of the semiconductor device. The argon atmosphere condition for promoting the silicidation, therefore, allow a considerable scaling down of the semiconductor devices such as MOS field effect transistors. The above argon atmosphere condition for promoting the silicidation may further allow a relatively low temperature heat treatment, for example, at a temperature less than approximately 750° C. for causing the intended silicidation without any excess silicidation namely over growth of refractory metal silicide layer over unintended region such as field oxide films.

If, contrary to the present invention, the heat treatment were carried out at a higher temperature such as 800° C. or above for silicidation, then there may be allowed any excess silicidation or over growth of refractory metal silicide layer over unintended region such as a passive region, for example, over field oxide films. The refractory metal silicide layer grown over the isolation film such as field oxide film in the MOS transistor may cause a leakage of current.

If, contrary to the present invention, the heat treatment is carried out in the presence of nitrogen or in the nitrogen containing atmosphere to supply nitrogen into the refractory metal nitride layer, then a supply of nitrogen atoms into the refractory metal nitride film from the atmosphere may prevent any reduction in concentration of nitrogen existing in the second layer even during the heat treatment and further promotes and allows nitrogen atoms to diffuse and approach in the vicinity of the interface of the first layer to the silicon surface by the heat treatment. Since the bonding reaction of nitrogen with silicon does take precedence over silicidation reaction between the refractory metal and silicon, a certain amount of the nitrogen atoms having been diffused and approached in the vicinity of the interface between the first layer and the silicon surface does prevent the intended silicidation reaction of refractory metal atoms with silicon atoms. This phenomenon in question will become remarkable as the thickness of the first layer is thin. This means it difficult to do a substantial scaling down of the device. From the above descriptions, a great deal of advantages in use of the argon atmosphere can be appreciated.

In addition, the use of the argon gas atmosphere for the heat treatment for silicidation provides a further advantage in lower price of argon than neon and helium whereby the manufacturing cost of the semiconductor device is also reduced.

The method may further include the following steps. The first and second layers are removed to leave the refractory metal silicide layer on the silicon surface before the refractory metal silicide layer is subjected to a secondary heat treatment at a higher temperature than the prior heat treatment in an atmosphere free of nitrogen to cause a phase transition of the refractory metal silicide layer thereby reducing a resistivity of the refractory metal silicide layer. The first and second layers may be removed by use of a chemical in which hydrogen peroxide is mixed in an anmonia solution. If the refractory metal is titanium, then the silicide layer has a C49 structure prior to the secondary heat treatment. When the C49 structure titanium silicide is subjected to the secondary heat treatment at a temperature higher than that of the prior heat treatment for silicidation, for example, at approximately 800° C. for about 10 seconds, then a phase transition of the titanium silicide appears and the C49 structure is changed into a C54 structure having a reduced resistivity. As a result, the phase transition can reduce the sheet resistance of the titanium silicide layer.

The above secondary heat treatment for causing the phase transition is preferably carried out in the argon gas atmosphere because if the secondary heat treatment is carried out in the argon atmosphere, then the transition temperature at which the phase transition of the refractory metal, for example, from C49 structured titanium silicide to C54 structured titanium silicide is lower than when the nitrogen gas atmosphere is used. Further, if the secondary heat treatment is carried out in the argon atmosphere and if the refractory metal layer such as titanium layer has a reduced thickness, then no transition temperature rise appears and the transition temperature remains low. Such low temperature heat treatment makes the semiconductor device free from any performance deterioration due to high temperature treatment.

The refractory metal is preferably titanium even any other refractory metals are available such as tungsten and molybdenum and others.

The present invention also provides a multi-layer structure comprising a silicon surface and a refractory metal silicide layer which extends over the silicon surface, wherein the refractory metal silicide layer is formed by a method comprising the following steps. A first layer made of a refractory metal is formed on the silicon surface, wherein the first layer has a thickness in the range of approximately 10–25 nanometers. A second layer is formed which extends over the first layer and is made of a nitrogen containing refractory metal. The silicon surface and the first and second layers are subjected to a heat treatment in an argon gas atmosphere to form a refractory metal silicide layer on an interface between the silicon surface and the first layer. The first and second layers are removed to leave the refractory metal silicide layer on the silicon surface.

The heat treatment is carried out at a temperature of less than about 750° C.

The refractory metal may be titanium and the refractory metal nitride layer may be a titanium nitride layer.

The refractory metal silicide layer is subjected to a secondary heat treatment in the argon gas atmosphere to cause a phase transition of the refractory metal silicide layer thereby reducing a resistivity of the refractory metal silicide layer. The secondary heat treatment is carried out at a temperature higher than that of the heat treatment for forming the refractory metal silicide layer.

The second layer may comprise a titanium nitride layer formed by depositing titanium nitride on the first layer and the second layer may comprise a titanium nitride layer formed by an ion implantation of nitrogen atoms into an upper region of the first layer.

The second layer has a thickness of not more than 20 nanometers.

The subject matter of the above tenth invention is substantially the same as the ninth invention, for which reason the tenth invention can be well understood from the above detailed descriptions of the ninth invention.

The present invention also provides a multi-layer structure comprising a refractory metal silicide layer which extends over a silicon surface, a first layer which extends over the refractory metal silicide layer, the first layer being made of a refractory metal wherein the first layer has a thickness in the range of approximately 10–25 nanometers, and a second layer which extends over the first layer and is made of a nitrogen containing refractory metal. The refractory metal silicide layer is formed by subjecting the silicon surface and the first and second layers to a heat treatment in an argon gas atmosphere to form the refractory metal silicide layer on an interface between the silicon surface and the first layer.

The heat treatment is carried out at a temperature of less than about 750° C.

The refractory metal may be titanium and the refractory metal nitride layer may be a titanium nitride layer.

The second layer may comprise a titanium nitride layer formed by depositing titanium nitride on the first layer. Alternatively, the second layer may comprise a titanium nitride layer formed by an ion implantation of nitrogen atoms into an upper region of the first layer.

The second layer has a thickness of not more than 20 nanometers.

The subject matter of the above eleventh invention is substantially the same as the ninth invention, for which reason the eleventh invention can be well understood from the above detailed descriptions of the ninth invention.

The present invention also provides a method for fabricating a semiconductor device. The method comprises the following steps. Field oxide films and a gate oxide film are formed on a surface of a silicon substrate. A gate electrode is selectively formed on a predetermined area of the gate oxide film. Side wall oxide films are selectively formed on opposite sides of the gate electrode. There is carrying out an ion implantation of an impurity having an opposite conductivity type to a conductivity type of the silicon substrate into the silicon substrate by use of the field oxide films, the side wall oxide films and the gate electrode as masks to form self-aligned source and drain regions. A first layer made of a refractory metal is formed on an entire surface of the silicon surface, wherein the first layer has a thickness in the range of approximately 10–25 nanometers. A second layer is formed which extends over the first layer and is made of a nitrogen containing refractory metal. The silicon surface and the first and second layers are subjected to a heat treatment in an argon gas atmosphere to form a refractory metal silicide layer on an interface between the silicon surface and the first layer. The first and second layers are removed to leave the refractory metal silicide layer on the silicon surface. The refractory metal silicide layer is subjected to a secondary heat treatment in the argon gas atmosphere to cause a phase transition of the refractory metal silicide layer thereby reducing a resistivity of the refractory metal silicide layer.

The heat treatment is carried out at a temperature of less than about 750° C. The refractory metal may be titanium and the refractory metal nitride layer may be a titanium nitride layer.

The secondary heat treatment is carried out at a temperature higher than that of the heat treatment for forming the refractory metal silicide layer.

The second layer may comprise a titanium nitride layer formed by depositing titanium nitride on the first layer.

The second layer may comprise a titanium nitride layer formed by an ion implantation of nitrogen atoms into an upper region of the first layer.

The second layer has a thickness of not more than 20 nanometers.

The subject matter of the above twelfth invention is substantially the same as the ninth invention, for which reason the twelfth invention can be well understood from the above detailed descriptions of the ninth invention.

The present invention also provides a method for forming a refractory metal silicide layer on a silicon surface. The method comprises the following steps. A first layer made of a refractory metal is formed on the silicon surface. A second layer is formed which extends over the first layer and is made of a nitrogen containing refractory metal. The silicon surface and the first and second layers are subjected to a heat treatment in an argon gas atmosphere to form a refractory metal silicide layer on an interface between the silicon surface and the first layer.

The heat treatment is carried out at a temperature of less than about 750° C. in an argon gas atmosphere. For the above present invention, it is also important that the above nitrogen free atmosphere is an argon gas atmosphere. Theoretically, other inert gases such as neon and helium seem to be available. Actually, however, only the argon gas is suitable whilst other inert gases are unsuitable. The argon gas has a weight relatively closer to that of the air. The argon gas is much heavier than neon and helium. The heat treatment, for example, annealing is carried out in a chamber filled with the argon gas atmosphere, wherein the laminated first and second layers over silicon are placed in the chamber. When the argon gas atmosphere is heated up by the annealing, a convection of the argon gas appears but the argon gas can surround the laminated first and second layers due to its sufficient atomic weight to thereby keep the nitrogen free atmosphere around the laminated first and second layers. By contrast, neon and helium are too light to remain around the laminated first and second layers when heated up, for which reason they seem unsuitable as an atmosphere to be used for the heat treatment for silicidation.

If, in accordance with the present invention, the heat treatment is carried out in the absence of nitrogen namely in the argon gas atmosphere to prevent any further supply of nitrogen into the refractory metal nitride layer during the heat treatment for silicidation, then a relatively small and limited amount of nitrogen atoms having pre-existed in the second layer is diffused by the heat treatment into the first layer made of the refractory metal. The diffused nitrogen atoms are, however, unlikely to move into positions in the vicinity of the interface between the first layer and the silicon surface. Namely, as a result of the heat treatment, the concentration of nitrogen atoms in the second layer made of the refractory metal nitride is reduced, and the diffusion depth of the nitrogen atoms is relatively shallow. In other words, the nitrogen atoms are kept from approaching the interface of the refractory metal layer to the silicon surface thereby allowing and promoting the intended silicidation even if the thickness of the first layer is extremely thin to comply with the requirement for considerable scaling down of the semiconductor device. The argon atmosphere condition for promoting the silicidation, therefore, allow a considerable scaling down of the semiconductor devices such as MOS field effect transistors. The above argon atmosphere condition for promoting the silicidation may further allow a relatively low temperature heat treatment, for example, at a temperature less than approximately 750° C. for causing the intended silicidation without any excess silicidation namely over growth of refractory metal silicide layer over unintended region such as field oxide films.

If, contrary to the present invention, the heat treatment were carried out at a higher temperature such as 800° C. or above for silicidation, then there may be allowed any excess silicidation or over growth of refractory metal silicide layer over unintended region such as a passive region, for example, over field oxide films. The refractory metal silicide layer grown over the isolation film such as field oxide film in the MOS transistor may cause a leakage of current.

If, contrary to the present invention, the heat treatment is carried out in the presence of nitrogen or in the nitrogen containing atmosphere to supply nitrogen into the refractory metal nitride layer, then a supply of nitrogen atoms into the refractory metal nitride film from the atmosphere may prevent any reduction in concentration of nitrogen existing in the second layer even during the heat treatment and further promotes and allows nitrogen atoms to diffuse and approach in the vicinity of the interface of the first layer to the silicon surface by the heat treatment. Since the bonding reaction of nitrogen with silicon does take precedence over silicidation reaction between the refractory metal and silicon, a certain amount of the nitrogen atoms having been diffused and approached in the vicinity of the interface between the first layer and the silicon surface does prevent the intended silicidation reaction of refractory metal atoms with silicon atoms. This phenomenon in question will become remarkable as the thickness of the first layer is thin. This means it difficult to do a substantial scaling down of the device. From the above descriptions, a great deal of advantages in use of the argon atmosphere can be appreciated.

In addition, the use of the argon gas atmosphere for the heat treatment for silicidation provides a further advantage in lower price of argon than neon and helium whereby the manufacturing cost of the semiconductor device is also reduced.

The method may further include the following steps. The first and second layers are removed to leave the refractory metal silicide layer on the silicon surface before the refractory metal silicide layer is subjected to a secondary heat treatment at a higher temperature than the prior heat treatment in an atmosphere free of nitrogen to cause a phase transition of the refractory metal silicide layer thereby reducing a resistivity of the refractory metal silicide layer. The first and second layers may be removed by use of a chemical in which hydrogen peroxide is mixed in an anmonia solution. If the refractory metal is titanium, then the silicide layer has a C49 structure prior to the secondary heat treatment. When the C49 structure titanium silicide is subjected to the secondary heat treatment at a temperature higher than that of the prior heat treatment for silicidation, for example, at approximately 800° C. for about 10 seconds, then a phase transition of the titanium silicide appears and the C49 structure is changed into a C54 structure having a reduced resistivity. As a result, the phase transition can reduce the sheet resistance of the titanium silicide layer.

The above secondary heat treatment for causing the phase transition is preferably carried out in the argon gas atmosphere because if the secondary heat treatment is carried out in the argon atmosphere, then the transition temperature at which the phase transition of the refractory metal, for example, from C49 structured titanium silicide to C54 structured titanium silicide is lower than when the nitrogen gas atmosphere is used. Further, if the secondary heat treatment is carried out in the argon atmosphere and if the refractory metal layer such as titanium layer has a reduced thickness, then no transition temperature rise appears and the transition temperature remains low. Such low temperature heat treatment makes the semiconductor device free from any performance deterioration due to high temperature treatment.

The refractory metal is preferably titanium even any other refractory metals are available such as tungsten and molybdenum and others. If the refractory metal is titanium, then the second layer may comprise a $Ti_xN_{1-x}$ layer formed by depositing titanium nitride on the first layer, where $1>x>0.5$. Alternatively, the second layer may comprise a $Ti_2N$ layer formed by sputtering a target of $Ti_2N$ in the absence of nitrogen.

The first layer has a thickness of not more than 30 nanometers. In the light of a possible reduction in thickness of the layers for scaling down of the semiconductor device, it is preferable that the first layer made of refractory metal such as titanium has a thickness in the range of about 10–25 nanometers and the second layer has a thickness of not more than 20 nanometers. If the first layer made of refractory metal such as titanium has a thickness in the range of about 10–25 nanometers, then the thickness of the silicide layer is in the range of about 15–40 nanometers. The thickness of about 10 nanometers is the critical thickness for allowing a formation of a certain titanium silicide layer in consideration of a time delay of initiation of the silicidation from nitrogen thermal diffusion from the second layer through the first layer toward the interface of the first layer and the silicon surface. If the thickness of the first layer is apparently smaller than the above critical thickness of about 10 nanometers, then nitrogen atoms have been diffused and already arrived at or around the interface and then the diffused nitride atoms have been bonded with silicon atoms on the silicon surface, although the intended silicidation is not yet initiated. As a result, no silicidation can be obtained. The above range in thickness of the first layer made of refractory metal such as titanium is important in the light of allowing not only the refractory metal silicidation but also a possible reduction in thickness of the layer for achieving the ultimate scaling down of the semiconductor device such as MOS field effect transistors.

The present invention also provides a multi-layer structure comprising a silicon surface and a refractory metal silicide layer which extends over the silicon surface, wherein the refractory metal silicide layer is formed by a method comprising the following steps. A first layer made of a refractory metal is formed on the silicon surface. A second layer is formed which extends over the first layer and is made of a nitrogen containing refractory metal. The silicon surface and the first and second layers are subjected to a heat treatment in an argon gas atmosphere to form a refractory metal silicide layer on an interface between the silicon surface and the first layer. The first and second layers are removed to leave the refractory metal silicide layer on the silicon surface.

The heat treatment is carried out at a temperature of less than about 750° C.

The refractory metal may be titanium and the refractory metal nitride layer may be a titanium nitride layer.

The refractory metal silicide layer is further subjected to a secondary heat treatment in the argon atmosphere to cause a phase transition of the refractory metal silicide layer thereby reducing a resistivity of the refractory metal silicide layer.

The secondary heat treatment is carried out at a temperature higher than that of the heat treatment for forming the refractory metal silicide layer.

The second layer may comprise a titanium nitride layer formed by depositing titanium nitride on the first layer. Alternatively, the second layer may comprise a titanium nitride layer formed by an ion implantation of nitrogen atoms into an upper region of the first layer.

The first layer has a thickness in the range of approximately 10–25 nanometers. The second layer has a thickness of not more than 20 nanometers. If the first layer made of refractory metal such as titanium has a thickness in the range of about 10–25 nanometers, then the thickness of the silicide layer is in the range of about 15–40 nanometers.

The subject matter of the above fourteenth invention is substantially the same as the thirteenth invention, for which reason the fourteenth invention can be well understood from the above detailed descriptions of the thirteenth invention.

The present invention also provides a multi-layer structure comprising a refractory metal silicide layer which extends over a silicon surface, a first layer which extends over the refractory metal silicide layer and is made of a refractory metal, and a second layer which extends over the first layer and is made of a nitrogen containing refractory metal. The refractory metal silicide layer is formed by subjecting the silicon surface and the first and second layers to a heat treatment in an argon gas atmosphere to form the refractory metal silicide layer on an interface between the silicon surface and the first layer.

The heat treatment is carried out at a temperature of less than about 750° C.

The refractory metal may be titanium and the refractory metal nitride layer may be a titanium nitride layer. The second layer may comprise a titanium nitride layer formed by depositing titanium nitride on the first layer. Alternatively, the second layer comprises a titanium nitride layer formed by an ion implantation of nitrogen atoms into an upper region of the first layer.

The first layer has a thickness in the range of approximately 10–25 nanometers. The second layer has a thickness of not more than 20 nanometers. If the first layer made of refractory metal such as titanium has a thickness in the range of about 10–25 nanometers, then the thickness of the silicide layer is in the range of about 15–40 nanometers.

The subject matter of the above fifteenth invention is substantially the same as the thirteenth invention, for which reason the fifteenth invention can be well understood from the above detailed descriptions of the thirteenth invention.

The present invention also provides a method for fabricating a semiconductor device. The method comprises the following steps. Field oxide films and a gate oxide film are formed on a surface of a silicon substrate. A gate electrode is selectively formed on a predetermined area of the gate oxide film. Side wall oxide films are formed on opposite sides of the gate electrode. There is carried out an ion implantation of an impurity having an opposite conductivity type to a conductivity type of the silicon substrate into the silicon substrate by use of the field oxide films, the side wall oxide films and the gate electrode as masks to form self-aligned source and drain regions. A first layer made of a refractory metal is formed on an entire surface of the silicon surface. A second layer is formed which extends over the first layer and is made of a nitrogen containing refractory metal. The silicon surface and the first and second layers are subjected to a heat treatment in an argon gas atmosphere to form a refractory metal silicide layer on an interface between the silicon surface and the first layer. The first and second layers are removed to leave the refractory metal silicide layer on the silicon surface. The refractory metal silicide layer is subjected to a secondary heat treatment in the argon gas atmosphere to cause a phase transition of the refractory metal silicide layer thereby reducing a resistivity of the refractory metal silicide layer.

The heat treatment is carried out at a temperature of less than about 750° C.

The refractory metal may be titanium and the refractory metal nitride layer may be a titanium nitride layer.

The secondary heat treatment is carried out at a temperature higher than that of the heat treatment for forming the refractory metal silicide layer.

The second layer may comprise a titanium nitride layer formed by depositing titanium nitride on the first layer. Alternatively, the second layer may comprise a titanium nitride layer formed by an ion implantation of nitrogen atoms into an upper region of the first layer.

The first layer has a thickness in the range of approximately 10–25 nanometers. The second layer has a thickness of not more than 20 nanometers. If the first layer made of refractory metal such as titanium has a thickness in the range of about 10–25 nanometers, then the thickness of the silicide layer is in the range of about 15–40 nanometers.

PREFERRED EMBODIMENTS

First Embodiment

A first embodiment according to the present invention will be described, wherein the above present invention is applied to a MOS field effect transistor. A method of forming a MOS field effect transistor with a titanium silicide layer is provided as follows.

Figure 4A:
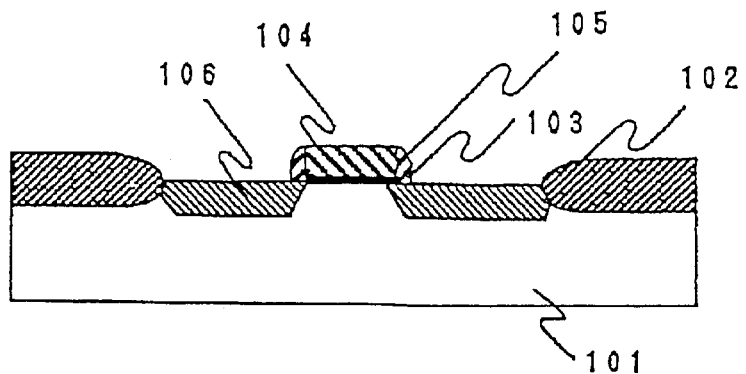
FIGS. 4A through 4E are fragmentary cross sectional elevation views illustrative of MOS field effect transistors in sequential processes involved in a novel fabrication method in a first embodiment according to the present invention.

With reference to FIG. 4A, a p-type silicon substrate 101 or in place a substrate having a p-well region was prepared. Field oxide films 102 were selectively formed by a local oxidation of silicon method on a surface of the p-type silicon substrate 101 so as to define an active region surrounded by the field oxide films 102. Further, an ion implantation of impurity into the active region was carried out to form a channel stopper. Subsequently, a thermal oxidation of silicon was carried out to form a gate oxide film 103 having a thickness of 8 nanometers. A chemical vapor deposition method was carried out to form a polysilicon film having a thickness of 100 nanometers over an entire region of the substrate 101. An n-type impurity such as phosphorus was doped into the deposited polysilicon film so as to reduce a resistivity of the polysilicon film. The impurity doped polysilicon film was then patterned by a photolithography to form a gate electrode 104. A chemical vapor deposition was carried out to deposit a silicon oxide film having a thickness of about 100 nanometers on an entire region of the substrate 101. The deposited silicon oxide film was then subjected to an anisotropic etching to form side wall oxide films 105 at opposite sides of the gate electrode 104. An ion-implantation of arsenic into the substrate 101 was carried out at a dose of about $1\times10^{15}$ atoms/cm$^2$ and then the substrate 101 was subjected to a heat treatment at a temperature of about 900° C. to cause a diffusion of the doped impurity whereby source/drain regions 106 were formed.

Figure 4B:
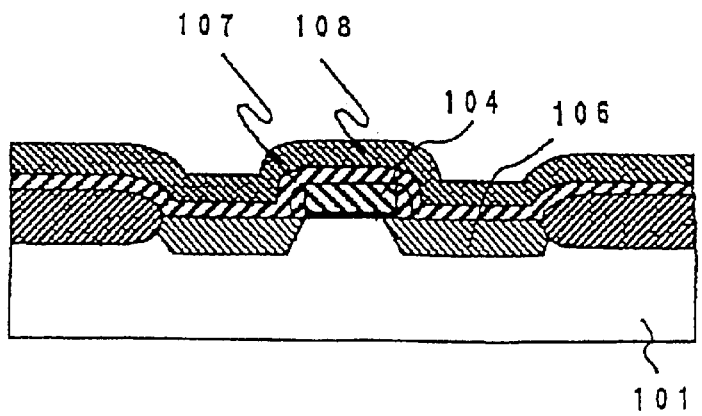

With reference to FIG. 4B, a titanium film 107 having a thickness of about 20 nanometers was deposited by a sputtering method on an entire region of the substrate 101. A titanium nitride film 108 having a thickness of 50 nanometers was formed over the titanium film 107.

Figure 4C:
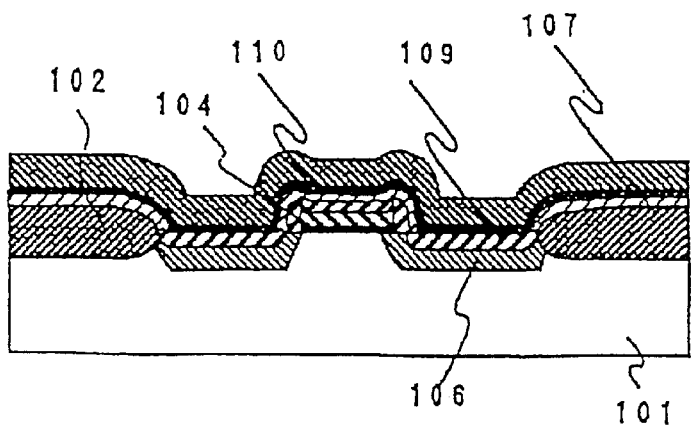

With reference to FIG. 4C, the substrate 101 was subjected to a lamp anneal in an argon atmosphere at a temperature of 700° C. for 30 seconds whereby a silicidation reaction of titanium with silicon appeared on interfaces of the titanium film 107 to the polysilicon gate electrode 104 and to the silicon diffusion layers 106 acting as the source/drain regions. As a result, C49 structured titanium silicide layers 109 were formed on the interfaces of the titanium film 107 to the polysilicon gate electrode 104 and to the silicon diffusion layers 106.

During the above heat treatment, for example, the lamp anneal, not only the nitrogen atoms in the titanium nitride film 108 but also silicon atoms in the source/drain diffusion regions 106 and the polysilicon gate electrode 104 are diffused. Silicon atoms are vertically and laterally diffused from the source/drain diffusion regions 106 and some of the silicon atoms move toward the titanium film 107 extending over the field oxide film 102. The diffusion of the nitrogen atoms from the titanium nitride film 108 into the titanium film 107 is, however, faster than and prior to the diffusion of the silicon. The above diffusion of the nitrogen atoms forms a titanium containing film 110 under the titanium nitride film 108 thereby promoting a nitriding reaction of titanium with nitrogen which appears over the field oxide film and is superior over any silicidation reaction of the over-diffused silicon atoms with the titanium atoms in the titanium film 107 over the field oxide film 102. For that reason, no titanium silicidation reaction appears over the field oxide film 102. Over growth of the titanium silicide layer is suppressed.

Figure 6:
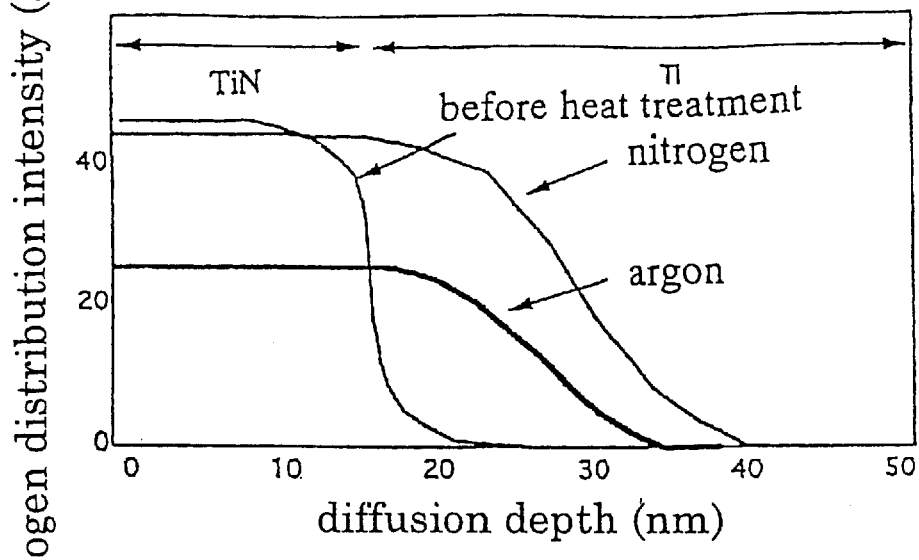
FIG. 6 is a diagram illustrative of distributions of nitrogen atoms in the titanium nitride film and the titanium film across the depth before and after heat treatments in a nitrogen atmosphere and an argon atmosphere.

FIG. 6 is a diagram illustrative of distributions of nitrogen atoms in the titanium nitride film and the titanium film across the depth before and after heat treatments in a nitrogen atmosphere and an argon atmosphere. FIG. 6 shows the following facts. If the heat treatment was carried out in the argon atmosphere, then no nitrogen is supplied into the titanium nitride film 108, for which reason the nitrogen concentration of the titanium nitride film 108 is reduced by the nitrogen diffusion from the titanium nitride film 108 during the heat treatment. Further, if the heat treatment was carried out in the argon atmosphere, then the depth of diffusion of nitrogen atoms from the titanium nitride film 108 to the titanium film 107 is shallower than when the heat treatment was carried out in the nitrogen atmosphere. This fact shows that the heat treatment in the argon atmosphere suppresses the nitrogen diffusion to the titanium film 107 thereby allowing and promoting titanium silicidation on the interface of the titanium film 107 to the silicon surface and the polysilicon surface whilst no titanium nitriding appears on the interfaces. Even if substantial reduction in thickness of the titanium layer 107 is intended for the purpose of the substantial scaling down of the semiconductor device, then the heat treatment in the argon atmosphere does never supply any nitrogen into the titanium nitride film 108 and does suppress the excess diffusion of nitrogen to the position in the vicinity of the above interface of the titanium film 107 to the silicon and polysilicon surfaces. This allows and promotes selective formation of an intended titanium silicide layer having a required thickness of, for example, about 30 nanometers without any over growth thereof.

Figure 4D:
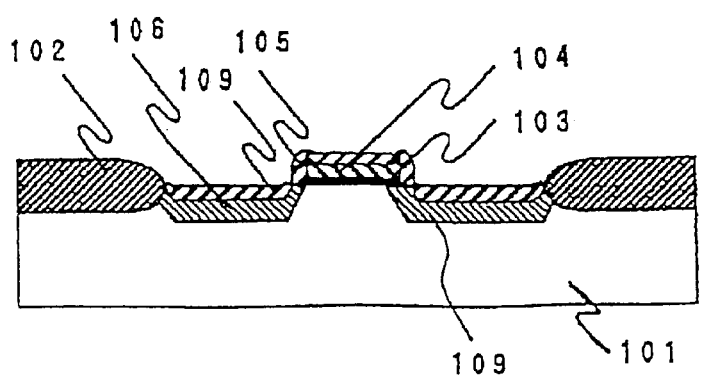
Figure 4E:
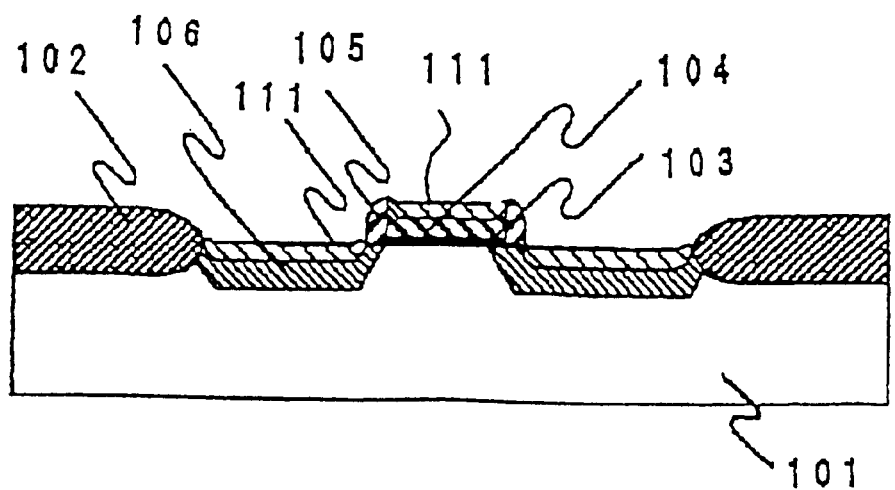

With reference back to FIG. 4D, the nitrogen containing titanium film 110 and the titanium nitride film 108 were removed by a wet etching which uses a chemical in which hydrogen peroxide is mixed in an ammonia solution so as to leave only the C49 structured titanium silicide layer 109 over the polysilicon gate electrode 104 and over the source and drain diffusion regions 106. With reference to FIG. 4E, the substrate 101 was subjected to a secondary heat treatment in an argon atmosphere at a temperature of 800° C. for 10 seconds to cause a phase transition of the C49 structured titanium silicide layer 109 into a C54 structured titanium silicide layer 111. The C54 structured titanium silicide layer 111 has a lower resistivity than the C49 structured titanium silicide layer 109, for which reason a sheet resistance of the titanium silicide layer is reduced by the secondary heat treatment.

Figure 7:
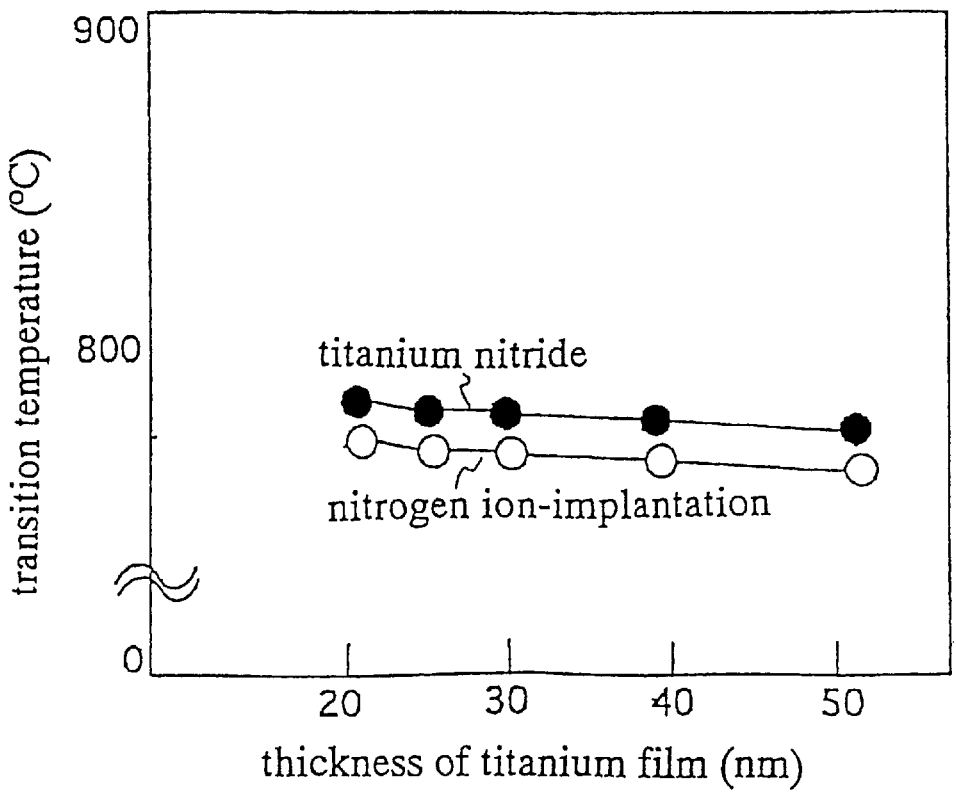
FIG. 7 is a diagram illustrative of variations in transition temperature of the titanium silicide layer from C49 structure into C54 structure versus the thickness of the titanium silicide layer when the phase transition appears by the heat treatment in the argon gas atmosphere.

FIG. 7 is a diagram illustrative of variations in transition temperature of the titanium silicide layer from C49 structure into C54 structure versus the thickness of the titanium silicide layer when the phase transition appears by the heat treatment in the argon gas atmosphere. The profile of the transition temperature of the titanium silicide layer from C49 structure into C54 structure is relatively flat over variation in thickness of the titanium silicide layer. This means that even if the thickness of the titanium film 107 is reduced for satisfying the requirement for the substantial scaling down of the semiconductor device, then the transition temperature of the titanium silicide layer from C49 structure to C54 structure remains low. This means that even if the thickness of the titanium film 107 is reduced, then the above phase transition appears at not so high temperature of not more than 800° C. There is no need to subject the substrate 101 to a higher temperature heat treatment which may deteriorate performances of the semiconductor device.

Figure 3:
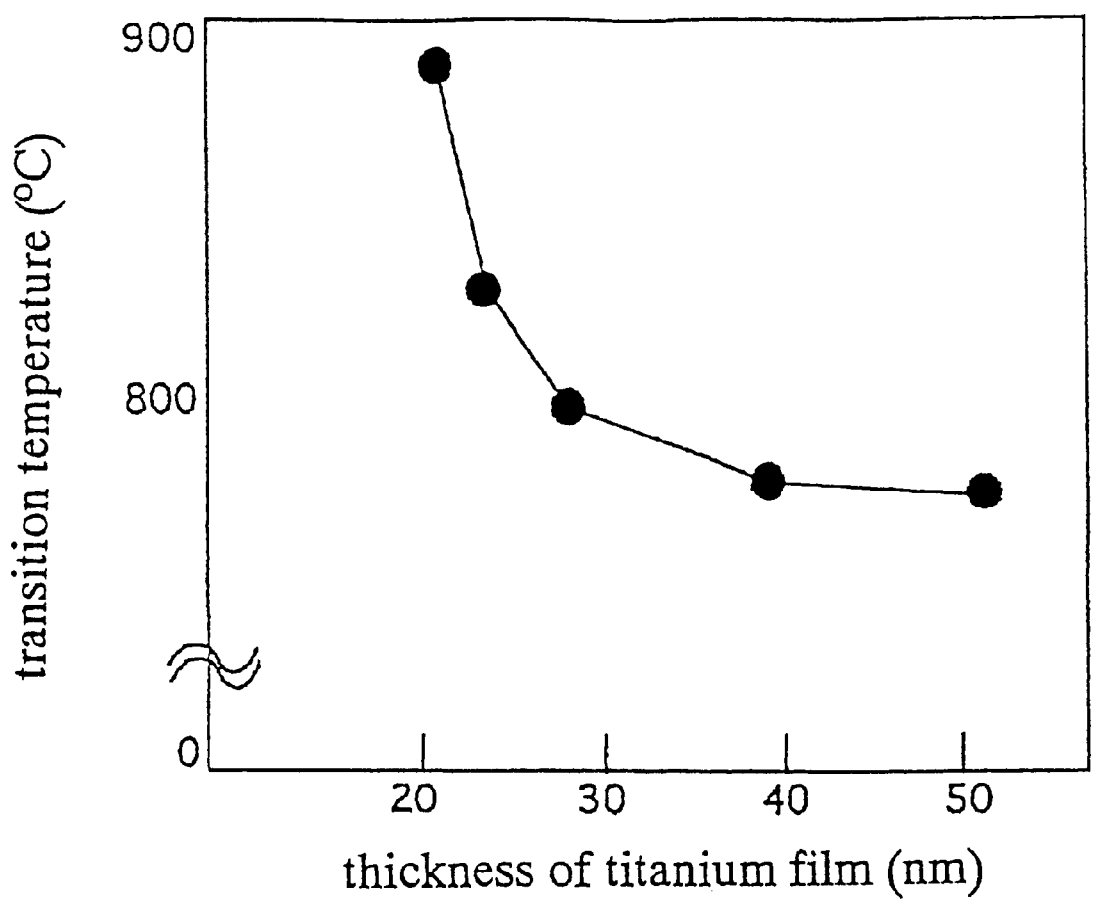
FIG. 3 is a diagram illustrative of variations in transition temperature of the titanium silicide layer from C49 structure into C54 structure versus the thickness of the titanium silicide layer when the phase transition appears by the heat treatment in the nitrogen gas atmosphere contrast to the present invention.

FIG. 3 is illustrative of variations in transition temperature of the titanium silicide layer from C49 structure into C54 structure versus the thickness of the titanium silicide layer when the phase transition appears by the heat treatment in the nitrogen gas atmosphere contrast to the present invention. From FIG. 3, it can be understood that the transition temperature of the titanium silicide layer from C49 structure into C54 structure is rapidly risen up as the thickness of the titanium film is reduced and approaches 20 nanometers. This means that if the thickness of the titanium film is reduced, then the transition temperature of the titanium silicide layer from C49 structure to C54 structure is rapidly risen up. This means that if the thickness of the titanium film is reduced, then the above phase transition appears at a higher temperature near 900° C. There is needed to subject the substrate to a higher temperature heat treatment which may deteriorate performances of the semiconductor device.

From the above descriptions, there can be appreciated a great deal of advantages in use of the argon gas atmosphere for the secondary heat treatment to cause the phase transition of the titanium silicide layer, particularly when the reduction in thickness of the titanium film 107 is needed for allowing the scaling down of the semiconductor device.

Second Embodiment

A second embodiment according to the present invention will be described, wherein the above present invention is applied to a MOS field effect transistor. A method of forming a MOS field effect transistor with a titanium silicide layer is provided as follows.

Figure 5A:
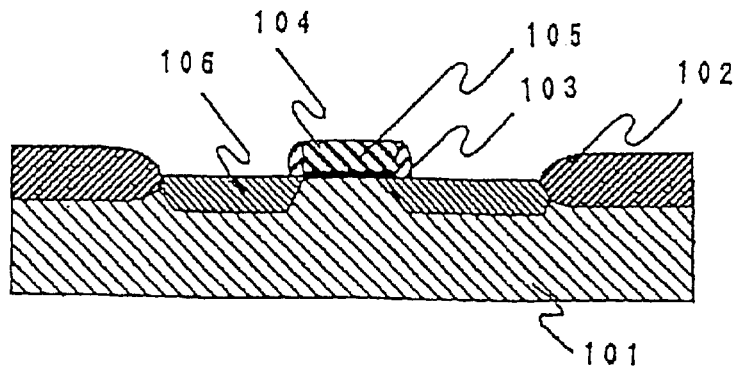
FIGS. 5A through 5E are fragmentary cross sectional elevation views illustrative of MOS field effect transistors in sequential processes involved in a novel fabrication method in a second embodiment according to the present invention.

With reference to FIG. 5A, a p-type silicon substrate 101 or in place a substrate having a p-well region was prepared. Field oxide films 102 were selectively formed by a local oxidation of silicon method on a surface of the p-type silicon substrate 101 so as to define an active region surrounded by the field oxide films 102. Further, an ion implantation of impurity into the active region was carried out to form a channel stopper. Subsequently, a thermal oxidation of silicon was carried out to form a gate oxide film 103 having a thickness of 8 nanometers. A chemical vapor deposition method was carried out to form a polysilicon film having a thickness of 100 nanometers over an entire region of the substrate 101. An n-type impurity such as phosphorus was doped into the deposited polysilicon film so as to reduce a resistivity of the polysilicon film. The impurity doped polysilicon film was then patterned by a photolithography to form a gate electrode 104. A chemical vapor deposition was carried out to deposit a silicon oxide film having a thickness of about 100 nanometers on an entire region of the substrate 101. The deposited silicon oxide film was then subjected to an anisotropic etching to form side wall oxide films 105 at opposite sides of the gate electrode 104. An ion-implantation of arsenic into the substrate 101 was carried out at a dose of about $1\times10^{15}$ atoms/cm$^2$ and then the substrate 101 was subjected to a heat treatment at a temperature of about 900° C. to cause a diffusion of the doped impurity whereby source/drain regions 106 were formed.

Figure 5B:
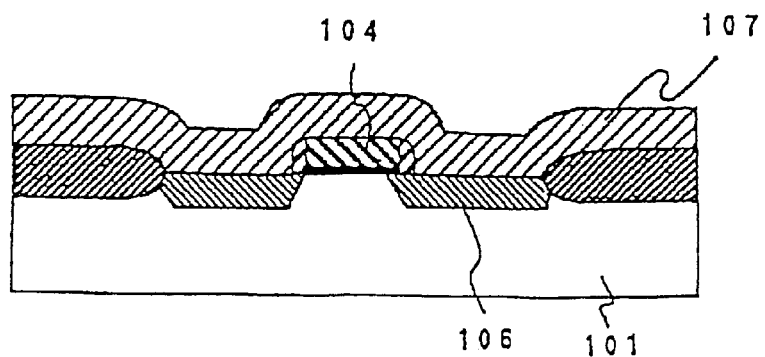

With reference to FIG. 5B, a titanium film 107 having a thickness of about 20 nanometers was deposited by a sputtering method on an entire region of the substrate 101.

Figure 5C:
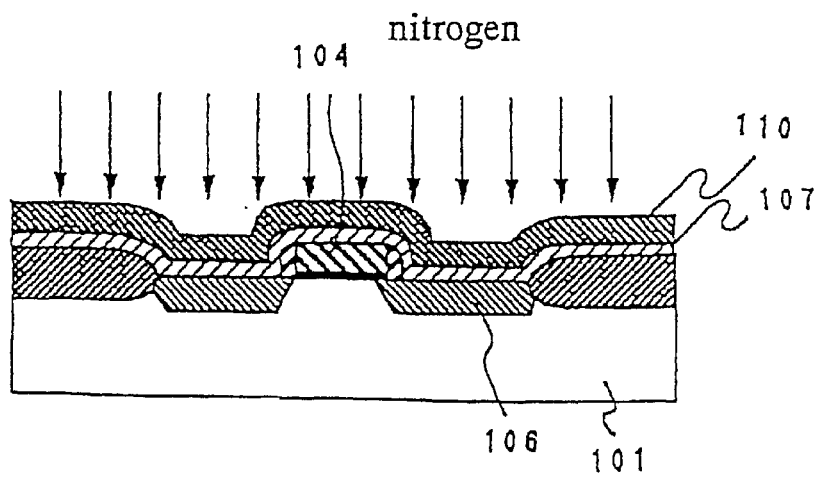

With reference to FIG. 5C, an ion implantation of nitrogen atoms into the titanium film 107 was carried out at a dose of $1\times10^{15}$ atoms/cm$^2$ and an acceleration energy of 50 keV.

Figure 5D:
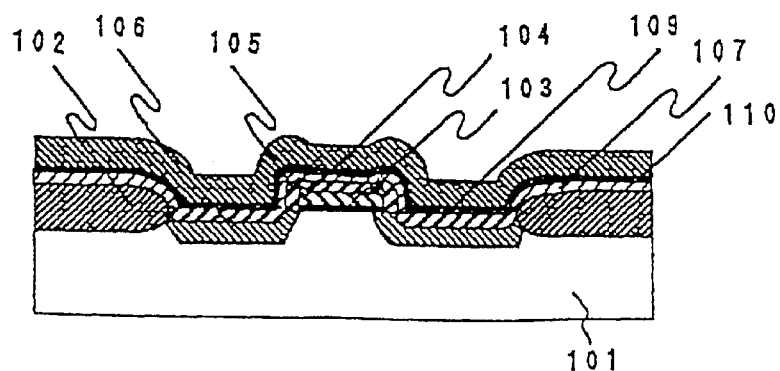

With reference to FIG. 5D, the substrate 101 was subjected to a lamp anneal in an argon gas atmosphere at a temperature of 700° C. for 30 seconds so as to cause thermal diffusion of the ion-implanted nitrogen whereby a nitrogen containing titanium film 110 was formed over the titanium film 107. as well as to cause a silicidation reaction of titanium with silicon on interfaces of the titanium film 107 to the polysilicon gate electrode 104 and to the source/drain silicon diffusion layers 106. As a result, C49 structured titanium silicide layers 109 were formed on the interfaces of the titanium film 107 to the polysilicon gate electrode 104 and to the silicon diffusion layers 106.

During the above heat treatment, for example, the lamp anneal, not only the nitrogen atoms in the nitrogen containing titanium film 110 but also silicon atoms in the source/drain diffusion regions 106 and the polysilicon gate electrode 104 are diffused. Silicon atoms are vertically and laterally diffused from the source/drain diffusion regions 106 and some of the silicon atoms move toward the titanium film 107 extending over the field oxide film 102. The diffusion of the nitrogen atoms from the nitrogen containing titanium film 110 into the titanium film 107 is, however, faster than and prior to the diffusion of the silicon, thereby promoting a nitriding reaction of titanium with nitrogen which appears over the field oxide film and is superior over any silicidation reaction of the over-diffused silicon atoms with the titanium atoms in the titanium film 107 over the field oxide film 102. For that reason, no titanium silicidation reaction appears over the field oxide film 102. Over growth of the titanium silicide layer is suppressed.

With reference gain to FIG. 6, if the heat treatment was carried out in the argon atmosphere, then no nitrogen is supplied into the titanium nitride film 108, for which reason the nitrogen concentration of the titanium nitride film 108 is reduced by the nitrogen diffusion from the titanium nitride film 108 during the heat treatment. Further, if the heat treatment was carried out in the argon atmosphere, then the depth of diffusion of nitrogen atoms from the titanium nitride film 108 to the titanium film 107 is shallower than when the heat treatment was carried out in the nitrogen atmosphere. This fact shows that the heat treatment in the argon atmosphere suppresses the nitrogen diffusion to the titanium film 107 thereby allowing and promoting titanium silicidation on the interface of the titanium film 107 to the silicon surface and the polysilicon surface whilst no titanium nitriding appears on the interfaces. Even if substantial reduction in thickness of the titanium layer 107 is intended for the purpose of the substantial scaling down of the semiconductor device, then the heat treatment in the argon atmosphere does never supply any nitrogen into the titanium nitride film 108 and does suppress the excess diffusion of nitrogen to the position in the vicinity of the above interface of the titanium film 107 to the silicon and polysilicon surfaces. This allows and promotes selective formation of an intended titanium silicide layer having a required thickness without any over growth thereof.

Figure 5E:
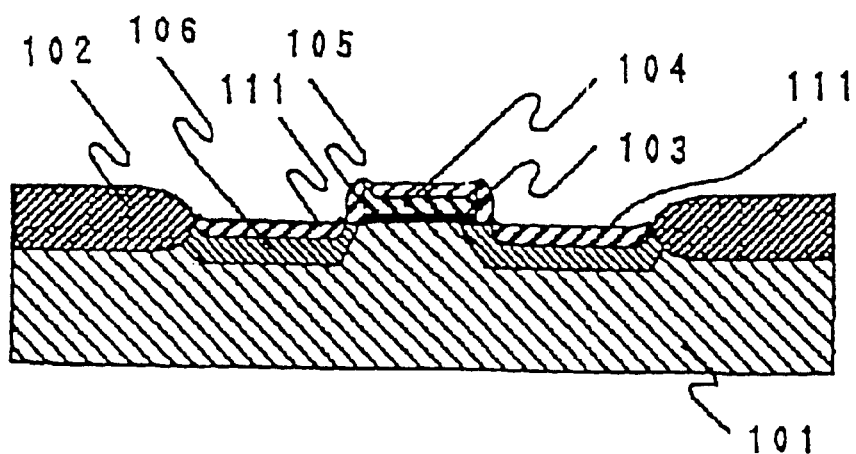

With reference back to FIG. 5E, the nitrogen containing titanium film 110 and the titanium film 107 were removed by a wet etching which uses a chemical in which hydrogen peroxide is mixed in an ammonia solution so as to leave only the C49 structured titanium silicide layer 109 over the polysilicon gate electrode 104 and over the source and drain diffusion regions 106. The substrate 101 was subjected to a secondary heat treatment in an argon atmosphere at a temperature of 800° C. for 10 seconds to cause a phase transition of the C49 structured titanium silicide layer 109 into a C54 structured titanium silicide layer 111. The C54 structured titanium silicide layer 111 has a lower resistivity than the C49 structured titanium silicide layer 109, for which reason a sheet resistance of the titanium silicide layer is reduced by the secondary heat treatment.

With reference again to FIG. 7, the profile of the transition temperature of the titanium silicide layer from C49 structure into C54 structure is relatively flat over variation in thickness of the titanium silicide layer. This means that even if the thickness of the titanium film 107 is reduced for satisfying the requirement for the substantial scaling down of the semiconductor device, then the transition temperature of the titanium silicide layer from C49 structure to C54 structure remains low. This means that even if the thickness of the titanium film 107 is reduced, then the above phase transition appears at not so high temperature of not more than 800° C. There is no need to subject the substrate 101 to a higher temperature heat treatment which may deteriorate performances of the semiconductor device.

By contrast, with reference to FIG. 3, the transition temperature of the titanium silicide layer from C49 structure into C54 structure is rapidly risen up as the thickness of the titanium film is reduced and approaches 20 nanometers. This means that if the thickness of the titanium film is reduced, then the transition temperature of the titanium silicide layer from C49 structure to C54 structure is rapidly risen up. This means that if the thickness of the titanium film is reduced, then the above phase transition appears at a higher temperature near 900° C. There is needed to subject the substrate to a higher temperature heat treatment which may deteriorate performances of the semiconductor device.

From the above descriptions, there can be appreciated a great deal of advantages in use of the argon gas atmosphere for the secondary heat treatment to cause the phase transition of the titanium silicide layer, particularly when the reduction in thickness of the titanium film 107 is needed for allowing the scaling down of the semiconductor device.

Third Embodiment

A third embodiment according to the present invention will be described, wherein the above present invention is applied to a MOS field effect transistor. A method of forming a MOS field effect transistor with a titanium silicide layer is provided as follows.

Figure 8A:
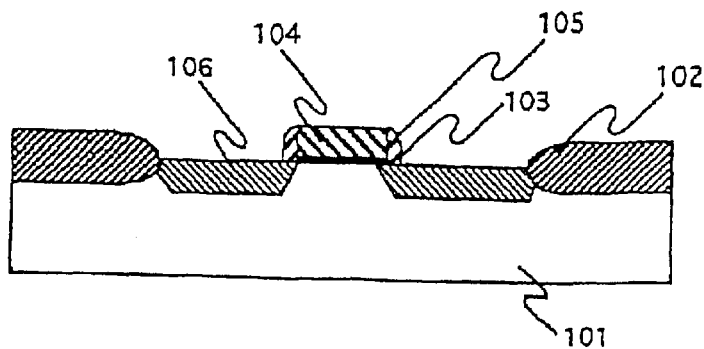
FIGS. 8A through 8E are fragmentary cross sectional elevation views illustrative of MOSFETs in sequential processes involved in a novel fabrication method in a third embodiment according to the present invention.

With reference to FIG. 8A, a p-type silicon substrate 101 or in place a substrate having a p-well region was prepared. Field oxide films 102 were selectively formed by a local oxidation of silicon method on a surface of the p-type silicon substrate 101 so as to define an active region surrounded by the field oxide films 102. Further, an ion implantation of impurity into the active region was carried out to form a channel stopper. Subsequently, a thermal oxidation of silicon was carried out to form a gate oxide film 103 having a thickness of 8 nanometers. A chemical vapor deposition method was carried out to form a polysilicon film having a thickness of 100 nanometers over an entire region of the substrate 101. An n-type impurity such as phosphorus was doped into the deposited polysilicon film so as to reduce a resistivity of the polysilicon film. The impurity doped polysilicon film was then patterned by a photolithography to form a gate electrode 104. A chemical vapor deposition was carried out to deposit a silicon oxide film having a thickness of about 100 nanometers on an entire region of the substrate 101. The deposited silicon oxide film was then subjected to an anisotropic etching to form side wall oxide films 105 at opposite sides of the gate electrode 104. An ion-implantation of arsenic into the substrate 101 was carried out at a dose of about $1 \times 10^{15}$ atoms/cm$^2$ and then the substrate 101 was subjected to a heat treatment at a temperature of about 900° C. to cause a diffusion of the doped impurity whereby source/drain regions 106 were formed.

Figure 8B:
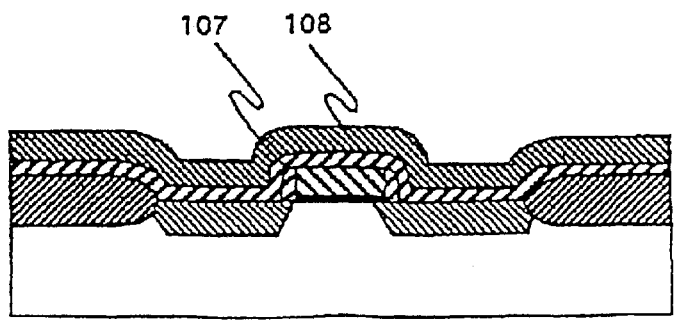

With reference to FIG. 8B, a titanium film 107 having a thickness of about 20 nanometers was deposited by a sputtering method on an entire region of the substrate 101. A titanium nitride film 108 having a thickness of 50 nanometers was formed over the titanium film 107.

Figure 8C:
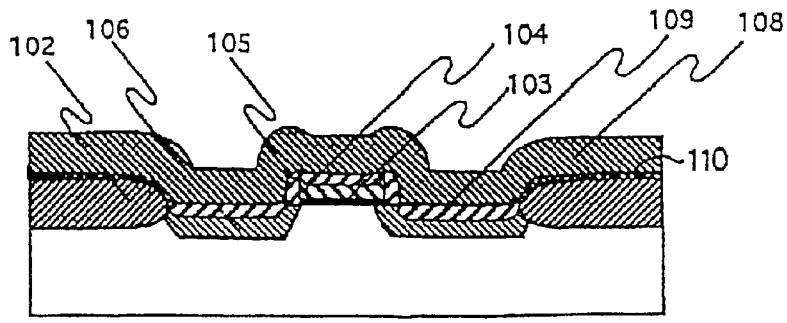

With reference to FIG. 8C, the substrate 101 was subjected to a lamp anneal in an argon gas atmosphere at a temperature of 700° C. for 30 seconds whereby a silicidation reaction of titanium with silicon appeared on interfaces of the titanium film 107 to the polysilicon gate electrode 104 and to the silicon diffusion layers 106 acting as the source/drain regions. As a result, C49 structured titanium silicide layers 109 having a thickness of 20 nanometers were formed on the interfaces of the titanium film 107 to the polysilicon gate electrode 104 and to the silicon diffusion layers 106.

During the above heat treatment, for example, the lamp anneal, not only the nitrogen atoms in the titanium nitride film 108 but also silicon atoms in the source/drain diffusion regions 106 and the polysilicon gate electrode 104 are diffused. Silicon atoms are vertically and laterally diffused from the source/drain diffusion regions 106 and some of the silicon atoms move toward the titanium film 107 extending over the field oxide film 102. The diffusion of the nitrogen atoms from the titanium nitride film 108 into the titanium film 107 is, however, faster than and prior to the diffusion of the silicon. The above diffusion of the nitrogen atoms forms a titanium containing film 110 under the titanium nitride film 108 thereby promoting a nitriding reaction of titanium with nitrogen which appears over the field oxide film and is superior over any silicidation reaction of the over-diffused silicon atoms with the titanium atoms in the titanium film 107 over the field oxide film 102. For that reason, no titanium silicidation reaction appears over the field oxide film 102. Over growth of the titanium silicide layer is suppressed.

Figure 9:
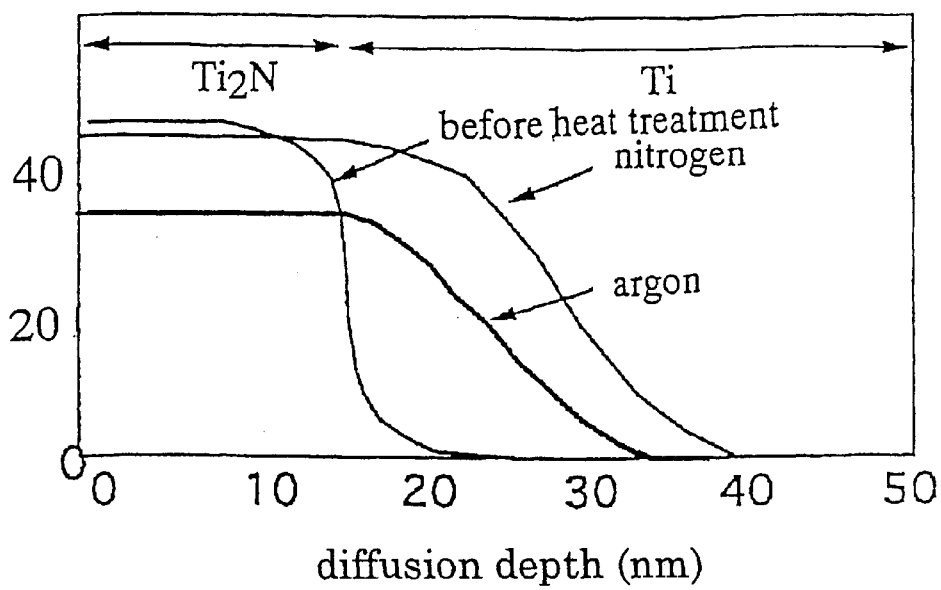
FIG. 9 is a diagram illustrative of distributions of nitrogen atoms in the titanium nitride film and the titanium film across the depth before and after heat treatments in a nitrogen atmosphere and an argon atmosphere.

FIG. 9 is a diagram illustrative of distributions of nitrogen atoms in the titanium nitride film and the titanium film across the depth before and after heat treatments in a nitrogen atmosphere and an argon atmosphere. FIG. 9 shows the following facts. If the heat treatment was carried out in the argon atmosphere, then no nitrogen is supplied into the titanium nitride film 108, for which reason the nitrogen concentration of the titanium nitride film 108 is reduced by the nitrogen diffusion from the titanium nitride film 108 during the heat treatment. Further, if the heat treatment was carried out in the argon atmosphere, then the depth of diffusion of nitrogen atoms from the titanium nitride film 108 to the titanium film 107 is shallower than when the heat treatment was carried out in the nitrogen atmosphere. This fact shows that the heat treatment in the argon atmosphere suppresses the nitrogen diffusion to the titanium film 107 thereby allowing and promoting titanium silicidation on the interface of the titanium film 107 to the silicon surface and the polysilicon surface whilst no titanium nitriding appears on the interfaces. Even if substantial reduction in thickness of the titanium layer 107 is intended for the purpose of the substantial scaling down of the semiconductor device, then the heat treatment in the argon atmosphere does never supply any nitrogen into the titanium nitride film 108 and does suppress the excess diffusion of nitrogen to the position in the vicinity of the above interface of the titanium film 107 to the silicon and polysilicon surfaces. This allows and promotes selective formation of an intended titanium silicide layer having a required thickness without any over growth thereof.

Figure 10:
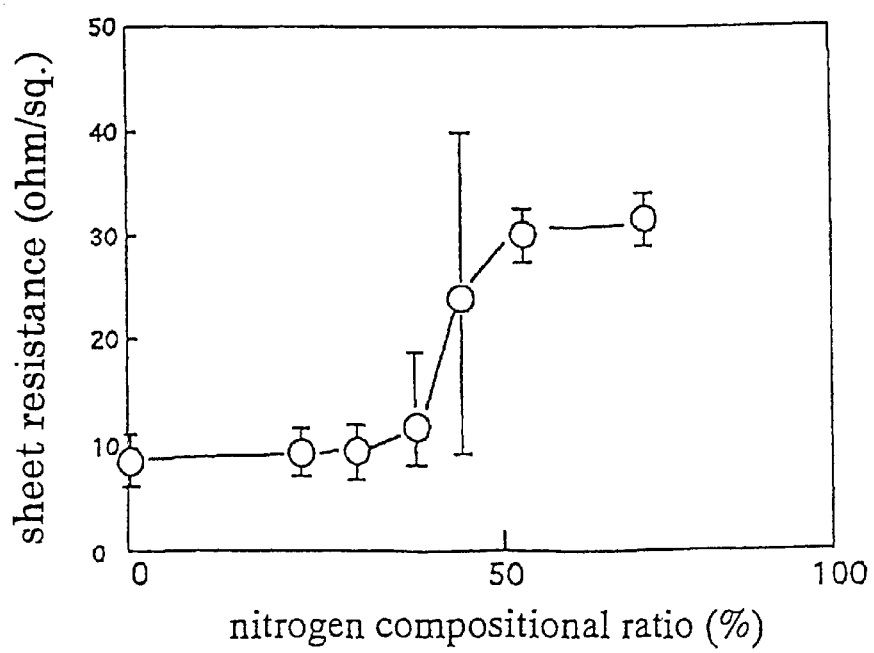
FIG. 10 is a diagram illustrative of variations in sheet resistance of a titanium silicide layer over nitrogen compositional ratio of the titanium nitride film or the nitrogen containing titanium film.

FIG. 10 is a diagram illustrative of variations in sheet resistance of a titanium silicide layer over nitrogen compositional ratio of the titanium nitride film or the nitrogen containing titanium film. FIG. 10 shows the following facts. As the nitrogen compositional ratio of the titanium nitride film is reduced from 50%, then the sheet resistance of the titanium silicide layer is dropped. If the nitrogen compositional ratio of the titanium nitride film is at or around 30%, then the sheet resistance of the titanium silicide layer remains not more than 10 Ω. The reduction in sheet resistance of the titanium silicide layer is caused not only by the phenomenon that if the nitrogen compositional ratio of the titanium nitride film is low, for example, about 30%, then the nitrogen diffusion depth is shallow and the titanium silicidation reaction is superior over the titanium nitriding reaction but also the weaker structural strength of the titanium nitride film by one order. If, however, the nitrogen compositional ratio of the titanium nitride film is too low, for example, much lower than 30%, then the nitrogen diffusion depth is too shallow whereby over growth of the titanium silicide layer appears. The over growth of the titanium silicide layer may cause a leakage of current. For example, the over grown silicide layer extending over the source/drain regions may cause a gate-source/drain leakage of current.

Figure 11:
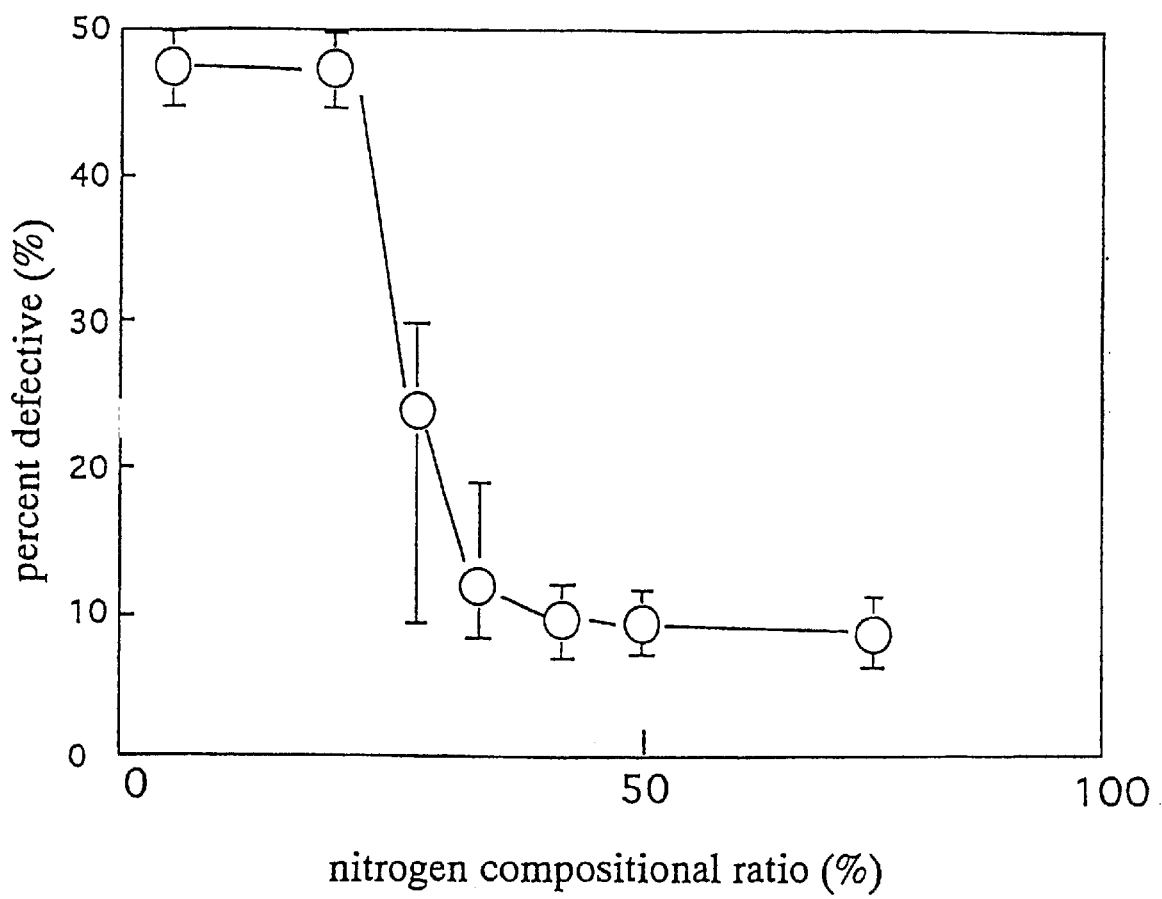
FIG. 11 is a diagram illustrative of a relationship of percent defective of the semiconductor device to nitrogen compositional ratio. The percent defective largely depends upon the over growth of the titanium silicide layer.

In order to suppress any over growth of the titanium silicide layer over the field oxide film 102, it is required that the nitrogen compositional ratio of the titanium nitride film is not so low, for example, not lower than about 30%. FIG. 11 is a diagram illustrative of a relationship of percent defective of the semiconductor device to nitrogen compositional ratio. The percent defective largely depends upon the over growth of the titanium silicide layer. From FIG. 11, it can be understood that if the nitrogen compositional ratio of the titanium nitride film is decreased from 30%, then the percent defective of the semiconductor device is rapidly increased.

In the light of both prevention of the over growth of the silicide layer over the field oxide film 102 and reduction in sheet resistance of the titanium silicide layer, the sheet resistance in the range of about 30–50% is preferable.

Figure 8D:
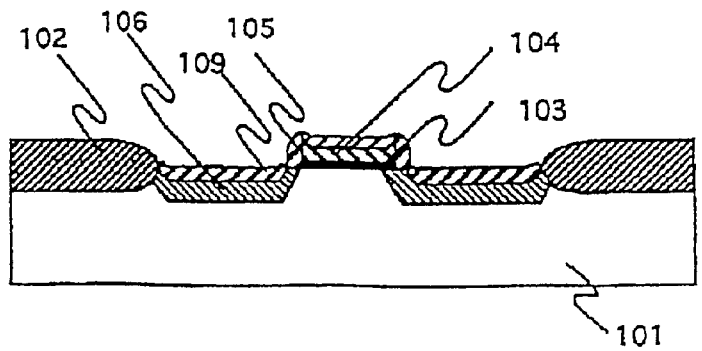

With reference back to FIG. 8D, the nitrogen containing titanium film 110 and the titanium nitride film 108 were removed by a wet etching which uses a chemical in which hydrogen peroxide is mixed in an ammonia solution so as to leave only the C49 structured titanium silicide layer 109 over the polysilicon gate electrode 104 and over the source and drain diffusion regions 106.

Figure 12:
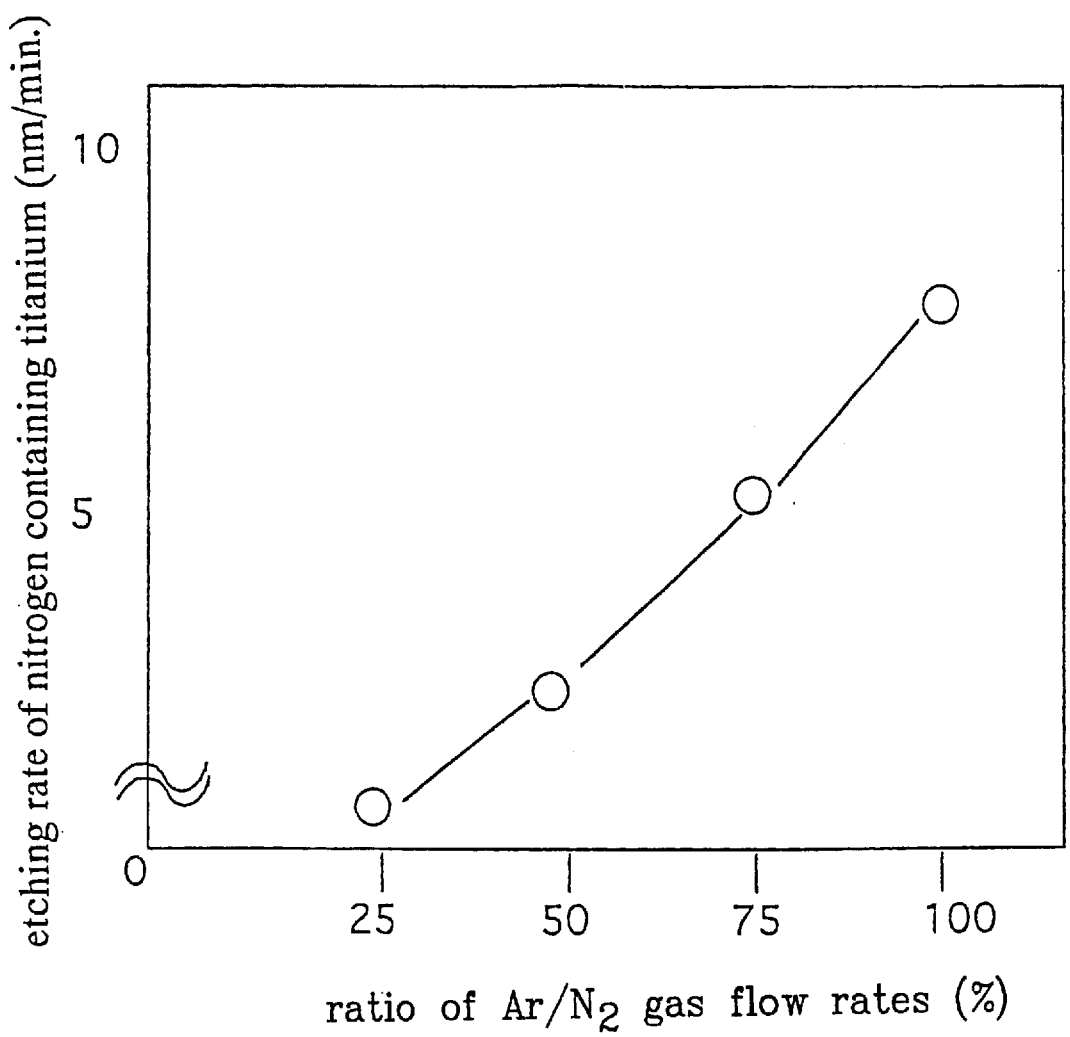
FIG. 12 is a diagram illustrative of an etching rate of a nitrogen containing titanium film over a ratio of $Ar/N_2$ gas flow rates in sputtering process for deposition of the nitrogen containing titanium film.

FIG. 12 is a diagram illustrative of an etching rate of a nitrogen containing titanium film over a ratio of Ar/N$_2$ gas flow rates in sputtering process for deposition of the nitrogen containing titanium film. From FIG. 12, it can be understood that as the ratio of Ar/N$_2$ gas flow rate in the sputtering process for deposition of the nitrogen containing titanium film 108 is increased from 25% to 100%, the etching rate of the nitrogen containing titanium film 108 is also increased from 0.6 nm/min. to over 8.0 nm/min. On the other hand, the titanium silicide layer 109 has an etching rate of about 2 nm/min. A selective etching rate of the nitrogen containing titanium film to the titanium silicide layer may be controlled by controlling the ratio of Ar/N$_2$ gas flow rates. If the selective etching rate of the nitrogen containing titanium film to the titanium silicide layer is set high, it may be easy to obtain an improvement in uniformity of the titanium silicide layer thickness.

Figure 8E:
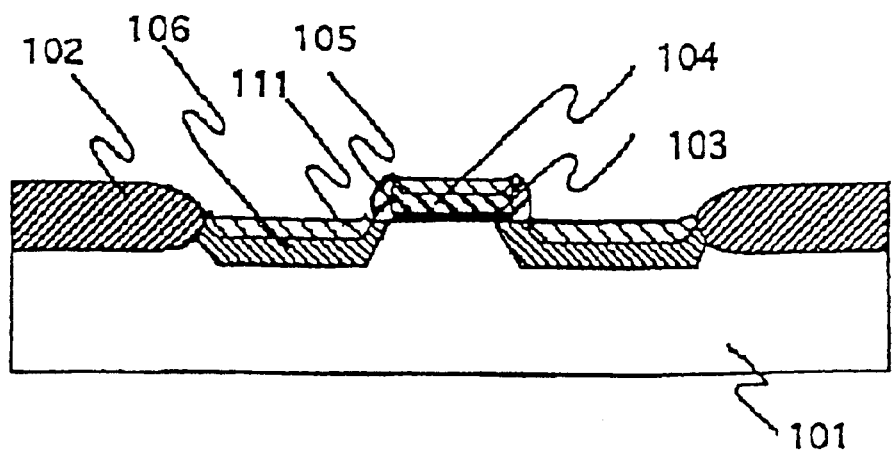

With reference to FIG. 8E, the substrate 101 was subjected to a secondary heat treatment in an argon atmosphere at a temperature of 800° C. for 10 seconds to cause a phase transition of the C49 structured titanium silicide layer 109 into a C54 structured titanium silicide layer 111. The C54 structured titanium silicide layer 111 has a lower resistivity than the C49 structured titanium silicide layer 109, for which reason a sheet resistance of the titanium silicide layer is reduced by the secondary heat treatment.

With reference again to FIG. 7, the profile of the transition temperature of the titanium silicide layer from C49 structure into C54 structure is relatively flat over variation in thickness of the titanium silicide layer. This means that even if the thickness of the titanium film 107 is reduced for satisfying the requirement for the substantial scaling down of the semiconductor device, then the transition temperature of the titanium silicide layer from C49 structure to C54 structure remains low. This means that even if the thickness of the titanium film 107 is reduced, then the above phase transition appears at not so high temperature of not more than 800° C. There is no need to subject the substrate 101 to a higher temperature heat treatment which may deteriorate performances of the semiconductor device.

By contrast, with reference back to FIG. 3, the transition temperature of the titanium silicide layer from C49 structure into C54 structure is rapidly risen up as the thickness of the titanium film is reduced and approaches 20 nanometers. This means that if the thickness of the titanium film is reduced, then the transition temperature of the titanium silicide layer from C49 structure to C54 structure is rapidly risen up. This means that if the thickness of the titanium film is reduced, then the above phase transition appears at a higher temperature near 900° C. There is needed to subject the substrate to a higher temperature heat treatment which may deteriorate performances of the semiconductor device.

From the above descriptions, there can be appreciated a great deal of advantages in use of the argon gas atmosphere for the secondary heat treatment to cause the phase transition of the titanium silicide layer, particularly when the reduction in thickness of the titanium film 107 is needed for allowing the scaling down of the semiconductor device.

Fourth Embodiment

A fourth embodiment according to the present invention will be described, wherein the above present invention is applied to a MOS field effect transistor. A method of forming a MOS field effect transistor with a titanium silicide layer is provided as follows. In this method, a titanium nitride film of TiN has a reduced thickness for reduction in structural strength for the purpose of facilitation and allowance of formation of a titanium silicide layer.

Figure 13A:
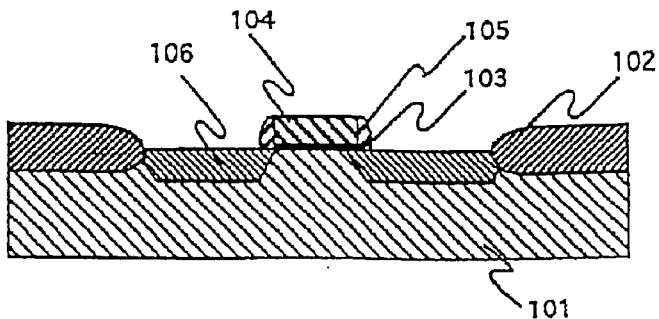
FIGS. 13A through 13E are fragmentary cross sectional elevation views illustrative of MOSFETs in sequential processes involved in a fabrication method in a fourth embodiment of the present invention.

With reference to FIG. 13A, a p-type silicon substrate 101 or in place a substrate having a p-well region was prepared. Field oxide films 102 were selectively formed by a local oxidation of silicon method on a surface of the p-type silicon substrate 101 so as to define an active region surrounded by the field oxide films 102. Further, an ion implantation of impurity into the active region was carried out to form a channel stopper. Subsequently, a thermal oxidation of silicon was carried out to form a gate oxide film 103 having a thickness of 8 nanometers. A chemical vapor deposition method was carried out to form a polysilicon film having a thickness of 100 nanometers over an entire region of the substrate 101. An n-type impurity such as phosphorus was doped into the deposited polysilicon film so as to reduce a resistivity of the polysilicon film. The impurity doped polysilicon film was then patterned by a photolithography to form a gate electrode 104. A chemical vapor deposition was carried out to deposit a silicon oxide film having a thickness of about 100 nanometers on an entire region of the substrate 101. The deposited silicon oxide film was then subjected to an anisotropic etching to form side wall oxide films 105 at opposite sides of the gate electrode 104. An ion-implantation of arsenic into the substrate 101 was carried out at a dose of about $1\times10^{15}$ atoms/cm$^2$ and then the substrate 101 was subjected to a heat treatment at a temperature of about 900° C. to cause a diffusion of the doped impurity whereby source/drain regions 106 were formed.

Figure 13B:
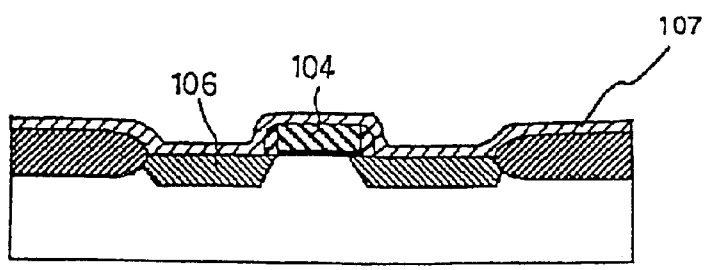

With reference to FIG. 13B, a titanium film 107 having a thickness of about 20 nanometers was deposited by a sputtering method on an entire region of the substrate 101.

Figure 13C:
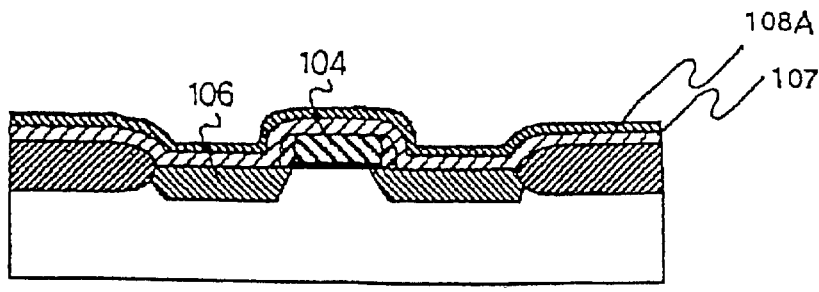

With reference to FIG. 13C, a titanium nitride film 108A having a thickness of 10 nanometers was formed over the titanium film 107.

Figure 13D:
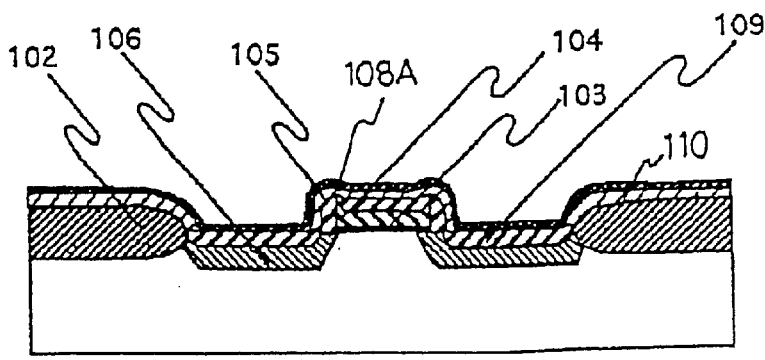
Figure 13E:
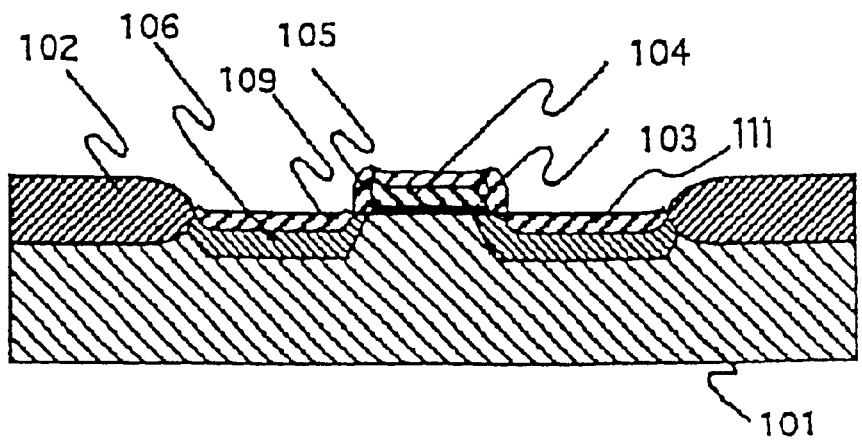

With reference to FIG. 13D, the substrate 101 was subjected to a lamp anneal in an argon gas atmosphere at a temperature of 700° C. for 30 seconds whereby a silicidation reaction of titanium with silicon appeared on interfaces of the titanium film 107 to the polysilicon gate electrode 104 and to the silicon diffusion layers 106 acting as the source/drain regions. As a result, C49 structured titanium silicide layers 109 having a thickness of 20 nanometers were formed on the interfaces of the titanium film 107 to the polysilicon gate electrode 104 and to the silicon diffusion layers 106.

During the above heat treatment, for example, the lamp anneal, not only the nitrogen atoms in the titanium nitride film 108 but also silicon atoms in the source/drain diffusion regions 106 and the polysilicon gate electrode 104 are diffused. Silicon atoms are vertically and laterally diffused from the source/drain diffusion regions 106 and some of the silicon atoms move toward the titanium film 107 extending over the field oxide film 102. The diffusion of the nitrogen atoms from the titanium nitride film 108 into the titanium film 107 is, however, faster than and prior to the diffusion of the silicon. The above diffusion of the nitrogen atoms forms a titanium containing film 110 under the titanium nitride film 108 thereby promoting a nitriding reaction of titanium with nitrogen which appears over the field oxide film and is superior over any silicidation reaction of the over-diffused silicon atoms with the titanium atoms in the titanium film 107 over the field oxide film 102. For that reason, no titanium silicidation reaction appears over the field oxide film 102. Over growth of the titanium silicide layer is suppressed.

Figure 14:
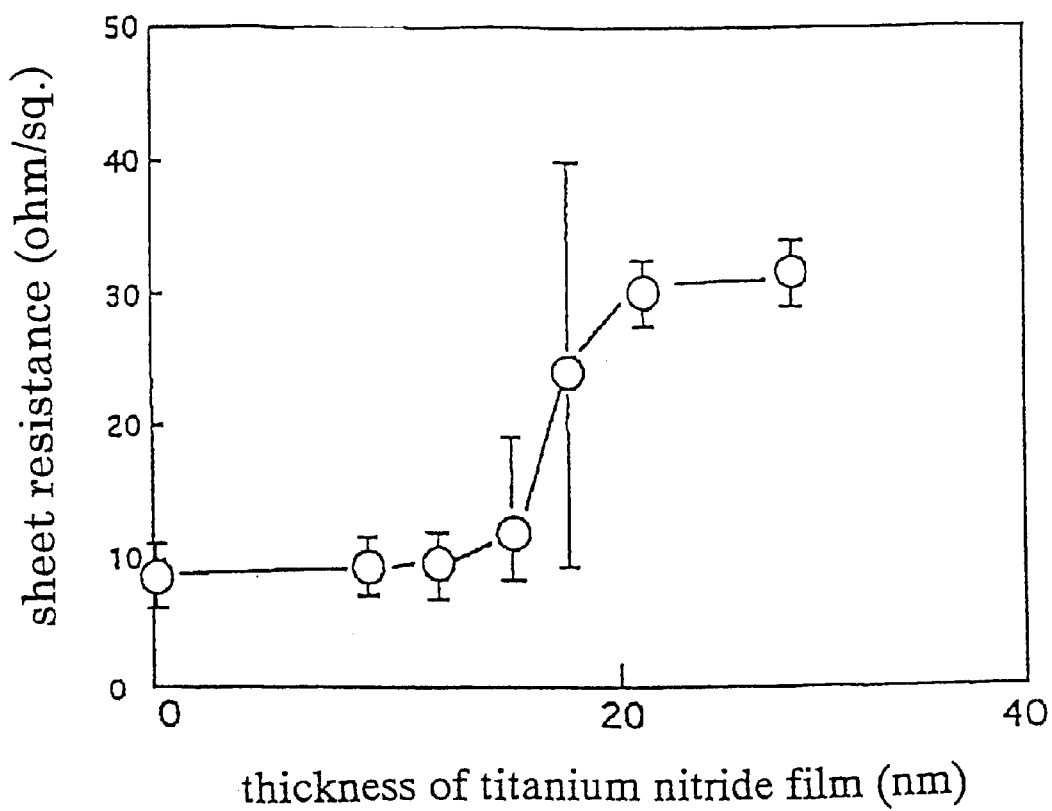
FIG. 14 is a diagram illustrative of variations in sheet resistance of the titanium silicide layer over thickness of the titanium nitride film.

FIG. 14 is a diagram illustrative of variations in sheet resistance of the titanium silicide layer over thickness of the titanium nitride film. From FIG. 14, it can be understood that if the thickness of the titanium nitride film 108A is reduced from 20 nanometers, then the sheet resistance of the titanium silicide layer 109 is rapidly dropped as long as the line width of the titanium silicide layer 109 is not less than about 0.2 micrometers. If the thickness of the titanium nitride film 108 is not more than about 10 nanometers, then the sheet resistance of the titanium silicide layer 109 remains lower than 10 ohm/sq. If the line width of 0.2 micrometers of the titanium nitride film 108A, the silicidation reaction is superior over the structural strength of the titanium nitride film 108A thereby allowing and promoting the formation of the titanium silicide layer. The reduction in thickness of the titanium nitride film 108A increases the silicidation reaction rate. If, however, the line width of the titanium silicide layer 109 is less than about 0.2 micrometers, then it is needed to reduce the thickness of the titanium nitride film 108A.

With reference again to FIG. 9, if the heat treatment was carried out in the argon atmosphere, then no nitrogen is supplied into the titanium nitride film 108, for which reason the nitrogen concentration of the titanium nitride film 108 is reduced by the nitrogen diffusion from the titanium nitride film 108 during the heat treatment. Further, if the heat treatment was carried out in the argon atmosphere, then the depth of diffusion of nitrogen atoms from the titanium nitride film 108 to the titanium film 107 is shallower than when the heat treatment was carried out in the nitrogen atmosphere. This fact shows that the heat treatment in the argon atmosphere suppresses the nitrogen diffusion to the titanium film 107 thereby allowing and promoting titanium silicidation on the interface of the titanium film 107 to the silicon surface and the polysilicon surface whilst no titanium nitriding appears on the interfaces. Even if substantial reduction in thickness of the titanium layer 107 is intended for the purpose of the substantial scaling down of the semiconductor device, then the heat treatment in the argon atmosphere does never supply any nitrogen into the titanium nitride film 108 and does suppress the excess diffusion of nitrogen to the position in the vicinity of the above interface of the titanium film 107 to the silicon and polysilicon surfaces. This allows and promotes selective formation of an intended titanium silicide layer having a required thickness without any over growth thereof.

With reference again to FIG. 10, as the nitrogen compositional ratio of the titanium nitride film is reduced from 50%, then the sheet resistance of the titanium silicide layer is dropped. If the nitrogen compositional ratio of the titanium nitride film is at or around 30%, then the sheet resistance of the titanium silicide layer remains not more than 10 Ω. The reduction in sheet resistance of the titanium silicide layer is caused not only by the phenomenon that if the nitrogen compositional ratio of the titanium nitride film is low, for example, about 30%, then the nitrogen diffusion depth is shallow and the titanium silicidation reaction is superior over the titanium nitriding reaction but also the weaker structural strength of the titanium nitride film by one order. If, however, the nitrogen compositional ratio of the titanium nitride film is too low, for example, much lower than 30%, then the nitrogen diffusion depth is too shallow whereby over growth of the titanium silicide layer appears. The over growth of the titanium silicide layer may cause a leakage of current. For example, the over grown silicide layer extending over the source/drain regions may cause a gate-source/drain leakage of current.

In order to suppress any over growth of the titanium silicide layer over the field oxide film 102, it is required that the nitrogen compositional ratio of the titanium nitride film is not so low, for example, not lower than about 30%. With reference again to FIG. 11, if the nitrogen compositional ratio of the titanium nitride film is decreased from 30%, then the percent defective of the semiconductor device is rapidly increased.

In the light of both prevention of the over growth of the silicide layer over the field oxide film 102 and reduction in sheet resistance of the titanium silicide layer, the sheet resistance in the range of about 30–50% is preferable.

With reference back to FIG. 13D, the nitrogen containing titanium film 110 and the titanium nitride film 108A were removed by a wet etching which uses a chemical in which hydrogen peroxide is mixed in an ammonia solution so as to leave only the C49 structured titanium silicide layer 109 over the polysilicon gate electrode 104 and over the source and drain diffusion regions 106. The reduction in thickness of the titanium nitride film 108A facilitates the removal thereof by etching. This facilitates the required prevention of etching of the extremely thin titanium silicide layer and can obtain a stable and intended sheet resistance of the titanium silicide layer.

With reference again to FIG. 7, the profile of the transition temperature of the titanium silicide layer from C49 structure into C54 structure is relatively flat over variation in thickness of the titanium silicide layer. This means that even if the thickness of the titanium film 107 is reduced for satisfying the requirement for the substantial scaling down of the semiconductor device, then the transition temperature of the titanium silicide layer from C49 structure to C54 structure remains low. This means that even if the thickness of the titanium film 107 is reduced, then the above phase transition appears at not so high temperature of not more than 800° C. There is no need to subject the substrate 101 to a higher temperature heat treatment which may deteriorate performances of the semiconductor device.

By contrast, with reference back to FIG. 3, the transition temperature of the titanium silicide layer from C49 structure into C54 structure is rapidly risen up as the thickness of the titanium film is reduced and approaches 20 nanometers. This means that if the thickness of the titanium film is reduced, then the transition temperature of the titanium silicide layer from C49 structure to C54 structure is rapidly risen up. This means that if the thickness of the titanium film is reduced, then the above phase transition appears at a higher temperature near 900° C. There is needed to subject the substrate to a higher temperature heat treatment which may deteriorate performances of the semiconductor device.

From the above descriptions, there can be appreciated a great deal of advantages in use of the argon gas atmosphere for the secondary heat treatment to cause the phase transition of the titanium silicide layer, particularly when the reduction in thickness of the titanium film 107 is needed for allowing the scaling down of the semiconductor device.

Whereas modifications of the present invention will be apparent o a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A method for fabricating a semiconductor device, comprising the steps of:

forming field oxide films and a gate oxide film on a surface of a silicon substrate;

selectively forming a gate electrode on a predetermined area of said gate oxide film;

selectively forming side wall oxide films on opposite sides of said gate electrode;

carrying out an ion implantation of an impurity having an opposite conductivity type to a conductivity type of said silicon substrate into said silicon substrate by use of said field oxide films, said side wall oxide films and said gate electrode as masks to form self-aligned source and drain regions;

forming a first layer made of a refractory metal on an entire surface of said silicon surface;

forming a second layer which extends over said first layer, said second layer being made of a nitrogen containing refractory metal, wherein a ratio in composition of nitrogen to said refractory metal is less than 1:1;

subjecting said silicon surface and said first and second layers to a heat treatment in a nitrogen free atmosphere having a pressure of not less than ultra high vacuum to form a refractory metal silicide layer on an interface between said silicon surface and said first layer;

removing said first and second layers to leave said refractory metal silicide layer on said silicon surface; and subjecting said refractory metal silicide layer to a secondary heat treatment in a nitrogen free atmosphere to cause a phase transition of said refractory metal silicide layer thereby reducing a resistivity of said refractory metal silicide layer.

2. The method as claimed in claim 1, wherein said nitrogen free atmosphere is an argon gas atmosphere.

3. The method as claimed in claim 1, wherein said heat treatment is carried out at a temperature of less than about 750° C.

4. The method as claimed in claim 1, wherein said refractory metal is titanium and said refractory metal nitride layer is $Ti_xN_{1-x}$, where 1>x>0.5.

5. The method as claimed in claim 1, wherein said secondary heat treatment is carried out at a temperature higher than that of said heat treatment for forming said refractory metal silicide layer.

6. The method as claimed in claim 1, wherein said second layer comprises a $Ti_xN_{1-x}$ layer formed by depositing titanium nitride on said first layer, where 1>x>0.5.

7. The method as claimed in claim 1, wherein said second layer comprises a $Ti_xN_{1-x}$ layer formed by an ion implantation of nitrogen atoms into an upper region of said first layer, where 1>x>0.5.

8. The method as claimed in claim 1, wherein said first layer has a thickness in the range of approximately 10–25 nanometers.

9. The method as claimed in claim 1, wherein said second layer has a thickness of not more than 20 nanometers.

10. A method for forming a refractory metal silicide layer on a silicon surface, said method comprising the steps of:

forming a first layer made of a refractory metal on said silicon surface, wherein said first layer has a thickness in the range of approximately 10–25 nanometers;

forming a second layer which extends over said first layer, said second layer being made of a nitrogen containing refractory metal; and subjecting said silicon surface and said first and second layers to a heat treatment in a nitrogen free atmosphere at ultra high vacuum to form a refractory metal silicide layer on an interface between said silicon surface and said first layer, wherein said second layer comprises a titanium nitride layer formed by an ion implantation of nitrogen atoms into an upper region of said first layer.

11. A method for fabricating a semiconductor device, comprising the steps of:

forming field oxide films and a gate oxide film on a surface of a silicon substrate;

selectively forming a gate electrode on a predetermined area of said gate oxide film;

selectively forming side wall oxide films on opposite sides of said gate electrode;

carrying out an ion implantation of an impurity having an opposite conductivity type to a conductivity type of said silicon substrate into said silicon substrate by use of said field oxide films, said side wall oxide films and said gate electrode as masks to form self-aligned source and drain regions;

forming a first layer made of a refractory metal on an entire surface of said silicon surface, wherein said first layer has a thickness in the range of approximately 10–25 nanometers;

forming a second layer which extends over said first layer, said second layer being made of a nitrogen containing refractory metal;

subjecting said silicon surface and said first and second layers to a heat treatment in a nitrogen free atmosphere having a pressure of not less than ultra high vacuum to form a refractory metal silicide layer on an interface between said silicon surface and said first layer;

removing said first and second layers to leave said refractory metal silicide layer on said silicon surface; and subjecting said refractory metal silicide layer to a secondary heat treatment in a nitrogen free atmosphere to cause a phase transition of said refractory metal silicide layer thereby reducing a resistivity of said refractory metal silicide layer.

12. The method as claimed in claim 11, wherein said nitrogen free atmosphere is an argon gas atmosphere.

13. The method as claimed in claim 11, wherein said heat treatment is carried out at a temperature of less than about 750° C.

14. The method as claimed in claim 11, wherein said refractory metal is titanium and said refractory metal nitride layer is a titanium nitride layer.

15. The method as claimed in claim 11, wherein said secondary heat treatment is carried out at a temperature higher than that of said heat treatment for forming said refractory metal silicide layer.

16. The method as claimed in claim 11, wherein said second layer comprises a titanium nitride layer formed by depositing titanium nitride on said first layer.

17. The method as claimed in claim 11, wherein said second layer comprises a titanium nitride layer formed by an ion implantation of nitrogen atoms into an upper region of said first layer.

18. The method as claimed in claim 11, wherein said second layer has a thickness of not more than 20 nanometers.

19. A method for forming a refractory metal silicide layer on a silicon surface, said method comprising the steps of:

forming a first layer made of a refractory metal on said silicon surface, wherein said first layer has a thickness in the range of approximately 10–25 nanometers;

layer, said second layer being made of a nitrogen containing refractory metal; and subjecting said silicon surface and said first and second layers to a heat treatment in an argon gas atmosphere to form a refractory metal silicide layer on an interface between said silicon surface and said first layer, wherein said second layer comprises a titanium nitride layer formed by an ion implantation of nitrogen atoms into an upper region of said first layer.

20. A method for fabricating a semiconductor device, comprising the steps of:

forming field oxide films and a gate oxide film on a surface of a silicon substrate;

selectively forming a gate electrode on a predetermined area of said gate oxide film;

selectively forming side wall oxide films on opposite sides of said gate electrode;

carrying out an ion implantation of an impurity having an opposite conductivity type to a conductivity type of said silicon substrate into said silicon substrate by use of said field oxide films, said side wall oxide films and said gate electrode as masks to form self-aligned source and drain regions;

forming a first layer made of a refractory metal on an entire surface of said silicon surface, wherein said first layer has a thickness in the range of approximately 10–25 nanometers;

forming a second layer which extends over said first layer, said second layer being made of a nitrogen containing refractory metal;

subjecting said silicon surface and said first and second layers to a heat treatment in an argon gas atmosphere to form a refractory metal silicide layer on an interface between said silicon surface and said first layer;

removing said first and second layers to leave said refractory metal silicide layer on said silicon surface; and subjecting said refractory metal silicide layer to a secondary heat treatment in an argon gas atmosphere to cause a phase transition of said refractory metal silicide layer thereby reducing a resistivity of said refractory metal silicide layer.

21. The method as claimed in claim 20, wherein said heat treatment is carried out at a temperature of less than about 750° C.

22. The method as claimed in claim 20, wherein said refractory metal is titanium and said refractory metal nitride layer is a titanium nitride layer.

23. The method as claimed in claim 20, wherein said secondary heat treatment is carried out at a temperature higher than that of said heat treatment for forming said refractory metal silicide layer.

24. The method as claimed in claim 20, wherein said second layer comprises a titanium nitride layer formed by depositing titanium nitride on said first layer.

25. The method as claimed in claim 20, wherein said second layer comprises a titanium nitride layer formed by an ion implantation of nitrogen atoms into an upper region of said first layer.

26. The method as claimed in claim 20, wherein said second layer has a thickness of not more than 20 nanometers.

27. A method for fabricating a semiconductor device, comprising the steps of:

forming field oxide films and a gate oxide film on a surface of a silicon substrate;

selectively forming a gate electrode on a predetermined area of said gate oxide film;

selectively forming side wall oxide films on opposite sides of said gate electrode;

carrying out an ion implantation of an impurity having an opposite conductivity type to a conductivity type of said silicon substrate into said silicon substrate by use of said field oxide films, said side wall oxide films and said gate electrode as masks to form self-aligned source and drain regions;

forming a first layer made of a refractory metal on an entire surface of said silicon surface;

forming a second layer which extends over said first layer, said second layer being made of a nitrogen containing refractory metal;

subjecting said silicon surface and said first and second layers to a heat treatment in an argon gas atmosphere to form a refractory metal silicide layer on an interface between said silicon surface and said first layer;

removing said first and second layers to leave said refractory metal silicide layer on said silicon surface; and subjecting said refractory metal silicide layer to a secondary heat treatment in an argon gas atmosphere to cause a phase transition of said refractory metal silicide layer thereby reducing a resistivity of said refractory metal silicide layer.

28. The method as claimed in claim 27, wherein said heat treatment is carried out at a temperature of less than about 750° C.

29. The method as claimed in claim 27, wherein said refractory metal is titanium and said refractory metal nitride layer is a titanium nitride layer.

30. The method as claimed in claim 27, wherein said secondary heat treatment is carried out at a temperature higher than that of said heat treatment for forming said refractory metal silicide layer.

31. The method as claimed in claim 27, wherein said second layer comprises a titanium nitride layer formed by depositing titanium nitride on said first layer.

32. The method as claimed in claim 27, wherein said second layer comprises a titanium nitride layer formed by an ion implantation of nitrogen atoms into an upper region of said first layer.

33. The method as claimed in claim 27, wherein said first layer has a thickness in the range of approximately 10–25 nanometers.

34. The method as claimed in claim 27, wherein said second layer has a thickness of not more than 20 nanometers.

* * * * *